US012770699B2

(12) United States Patent
Xing et al.

(10) Patent No.: US 12,770,699 B2
(45) Date of Patent: Oct. 20, 2026

(54) NON-VOLATILE MEMORY WITH SMART TAIL DETECTION READ MODE WITHOUT ERASE TIME PENALTY

(71) Applicant: Sandisk Technologies, Inc., Milpitas, CA (US)

(72) Inventors: Jojo Xing, Shanghai (CN); Xuan Tian, Shanghai (CN); Liang Li, Shanghai (CN); Vincent Yin, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 146 days.

(21) Appl. No.: 19/003,033

(22) Filed: Dec. 27, 2024

(65) Prior Publication Data

US 2026/0188399 A1 Jul. 2, 2026

(51) Int. Cl.
*G11C 16/34* (2006.01)
*G11C 16/04* (2006.01)
*G11C 16/16* (2006.01)

(52) U.S. Cl.
CPC ...... *G11C 16/3472* (2013.01); *G11C 16/0483* (2013.01); *G11C 16/16* (2013.01)

(58) Field of Classification Search
CPC .. G11C 16/3472; G11C 16/0483; G11C 16/16
See application file for complete search history.

(56) References Cited

U.S. PATENT DOCUMENTS 7,957,187 B2 6/2011 Mokhlesi et al.
7,965,554 B2 6/2011 Lutze et al.
8,223,558 B2 7/2012 Tanaka et al.
8,885,412 B2 11/2014 Li et al.
9,019,775 B2 4/2015 Costa et al.
9,036,417 B2 5/2015 Chen et al.
9,076,545 B2 7/2015 Mokhlesi
RE45,871 E 1/2016 Lai et al.
9,343,159 B2 5/2016 Rabkin et al.
9,711,211 B2 7/2017 Masuduzzaman et al.
9,761,320 B1 9/2017 Chen et al.
10,353,598 B2 7/2019 Huang et al.
10,923,196 B1 2/2021 Rabkin et al.
2023/0215501 A1 * 7/2023 Seo .................... G11C 16/0483
365/185.29

(Continued)

OTHER PUBLICATIONS

U.S. Appl. No. 18/415,224, filed Jan. 17, 2024.

(Continued)

*Primary Examiner* — Min Huang
(74) *Attorney, Agent, or Firm* — Pearl Cohen LLP

(57) ABSTRACT

To determine NAND memory blocks with an upper tail or a lower tail of select gate threshold voltage levels, a tail detection read is introduced into the erase process. To minimize the time penalty on the erase process, the tail detection read is only performed for a specified loop in the erase verify process. More specifically, in an erase process using an algorithm of a loop of applying an erase pulse followed by an erase verify operation, an erase loop count is maintained and incremented at each loop. If the block fails erase verify, before looping back for the next erase pulse a tail detection read is performed, but only if the erase loop count equals a specified value (which can be a settable parameter); otherwise, the tail detection read is not performed.

20 Claims, 23 Drawing Sheets

(56) References Cited

U.S. PATENT DOCUMENTS

| | | | | |
|---|---|---|---|---|
| 2024/0071533 | A1 | 2/2024 | Liu et al. | |
| 2024/0428861 | A1* | 12/2024 | Choi | G11C 16/3459 |
| 2025/0391490 | A1* | 12/2025 | Lee | G11C 16/24 |
| 2026/0073994 | A1* | 3/2026 | Wang | G11C 11/5635 |
| 2026/0105965 | A1* | 4/2026 | Choi | G11C 16/0483 |

OTHER PUBLICATIONS

U.S. Appl. No. 18/635,463, filed Apr. 15, 2024.
U.S. Appl. No. 18/419,205, filed Jan. 22, 2024.
U.S. Appl. No. 18/624,898, filed Apr. 2, 2024.
Liu, Chun-Yi et al., "PEN: Design and Evaluation of Partial-Erase for 3D NAND-Based High Density SSDS", 16th USENIX Conference on File and Storage Technologies, USENIX Association, Feb. 12-15, 2018, Oakland, California, pp. 67-82.

* cited by examiner

NON-VOLATILE MEMORY WITH SMART TAIL DETECTION READ MODE WITHOUT ERASE TIME PENALTY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory that the non-volatile memory operate reliably (e.g., user be able to successfully read back data stored in the non-volatile memory).

BRIEF DESCRIPTION OF THE DRAWINGS

Like-numbered elements refer to common components in the different figures.

DETAILED DESCRIPTION

In a NAND memory architectures, blocks of memory cells are made up of NAND strings, where multiple memory cells are connected in series between one or more source side select gates, through which they are connected to a source line, and one or more drain side select gates, through which they are connected to a bit line. For a NAND string to properly operate, the threshold voltages for the select gates of the string turn on and off need to be in well-defined distributions. In addition to being used for the NAND string select/deselect function, some embodiments for NAND memory can use the select gates nearest one or both of the bit line or the source in a gate induced drain leakage, or GIDL, erase mechanism for the blocks of memory cells. If the GIDL related select gates have a high/low threshold, like an upper tail/lower tail of the threshold distribution for these select gates, the erase function may not operate properly, leading more erase-verify loops or even an erase failure.

To determine blocks with such an upper tail or a lower tail of select gate threshold voltage levels, a tail detection read (TDR) is introduced into the erase process. To minimize the time penalty on the erase operation, the tail detection read is only performed for a specified erase loop in the erase verify process. More specifically, in an erase process using an algorithm of a loop of applying an erase pulse followed by an erase verify operation, an erase loop count is maintained and incremented at each loop. If the block fails erase verify, before looping back for the next erase pulse a tail detection read is performed, but only if the erase loop count equals a specified value (which can be a settable parameter); otherwise, the tail detection read is not performed. This allows for the tail detection read to be incorporated into the erase process to catch blocks with an upper tail or a lower tail in the distribution of select gate threshold voltages, while still having a limited effect on erase times.

Figure 1:
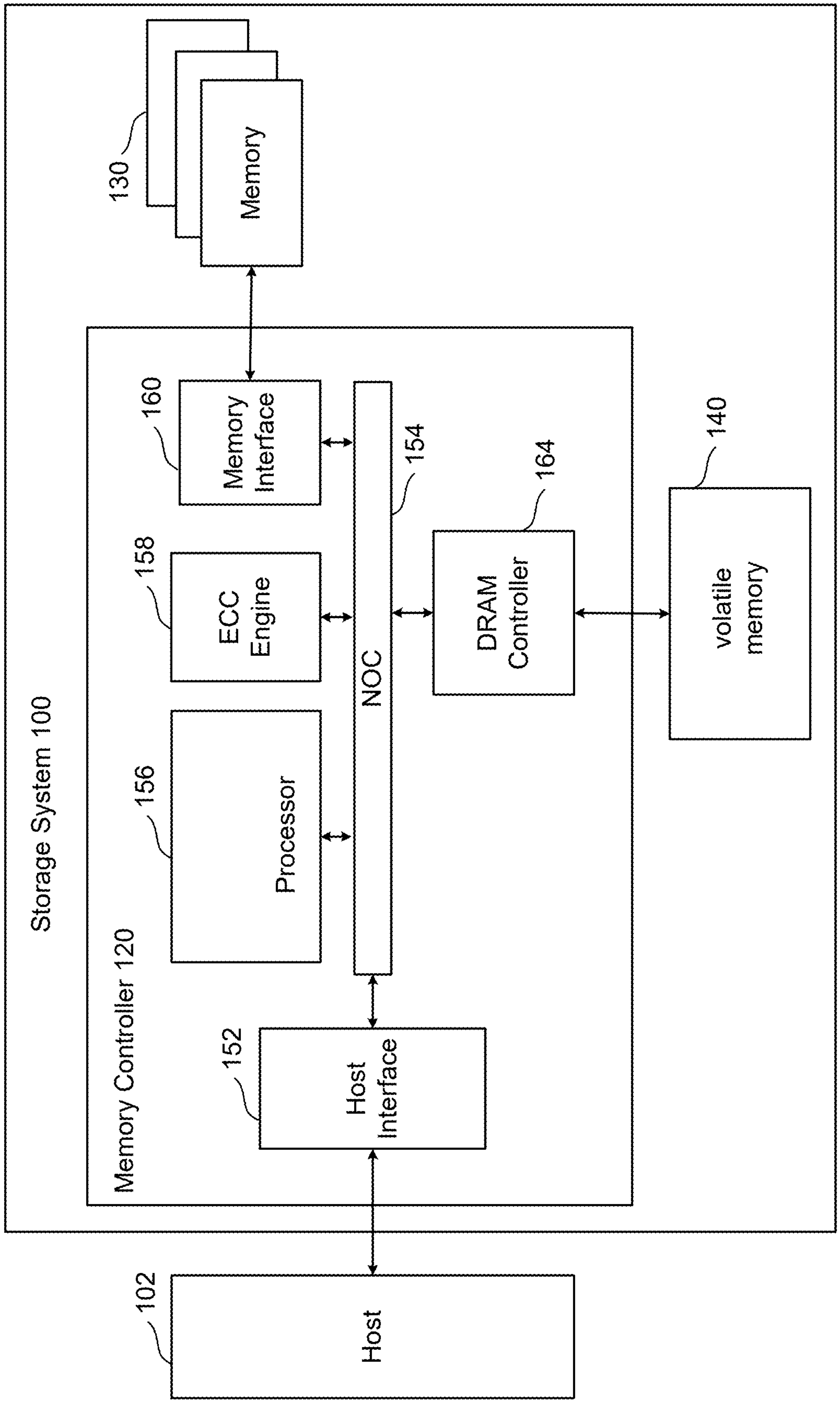
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
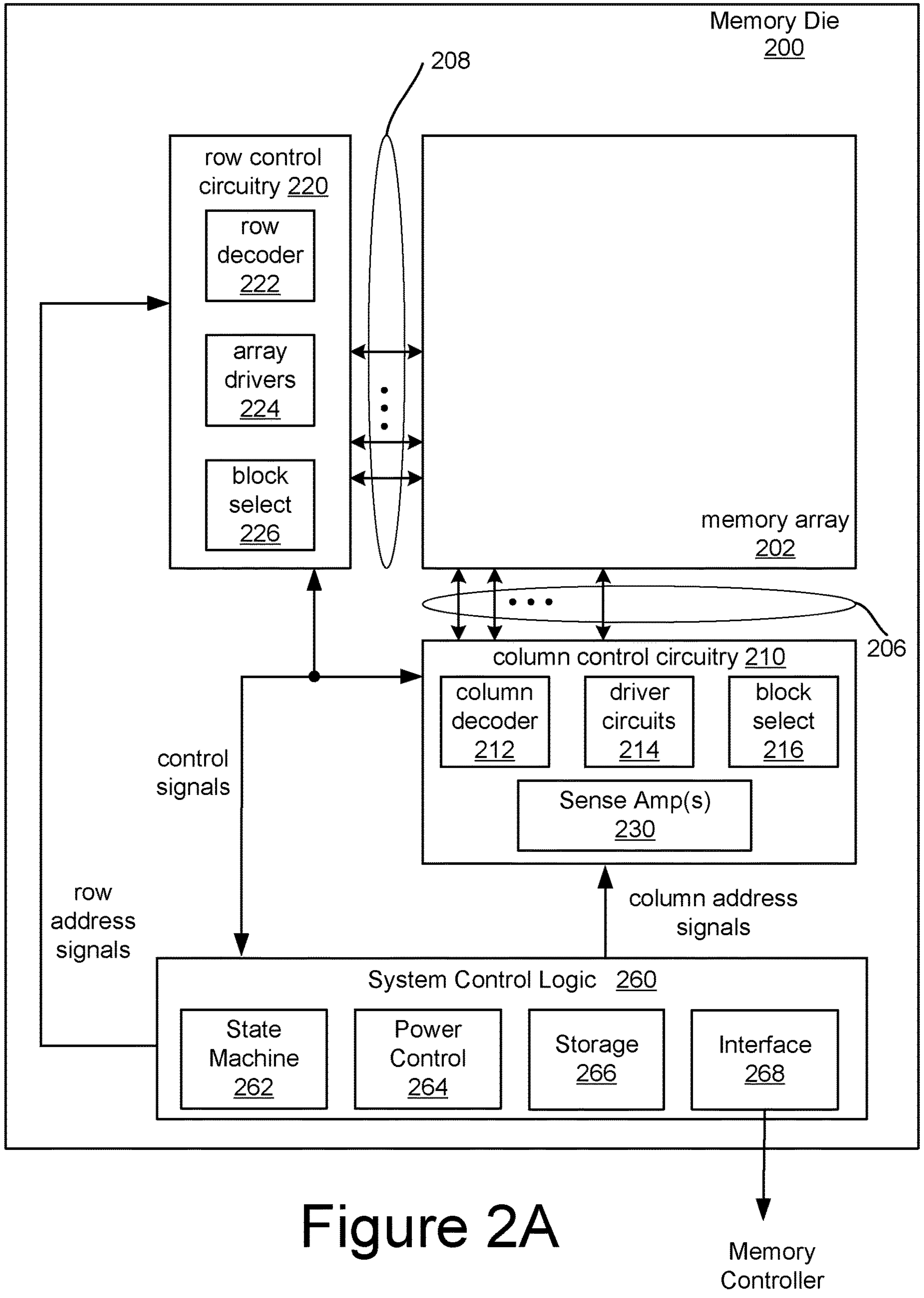
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
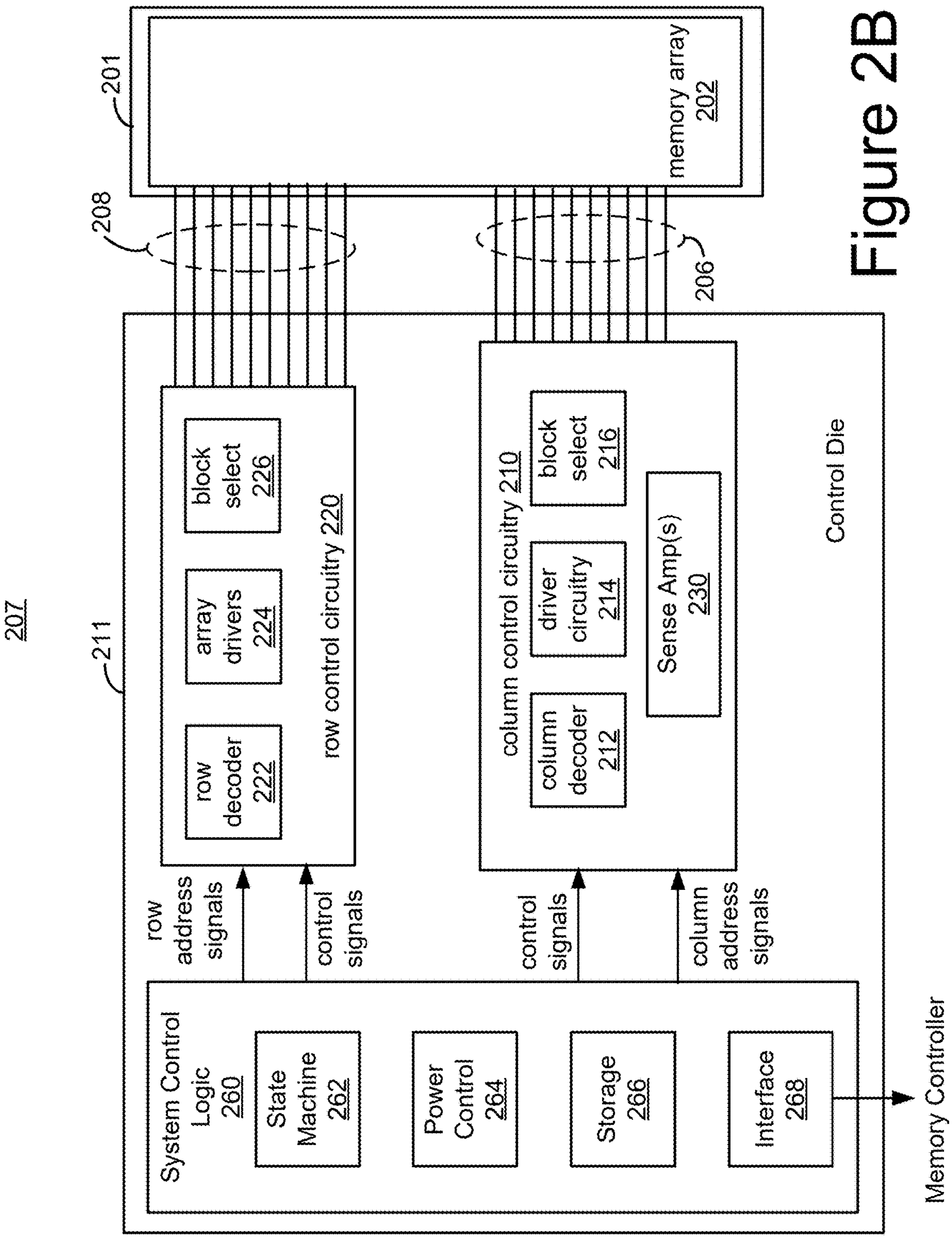
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
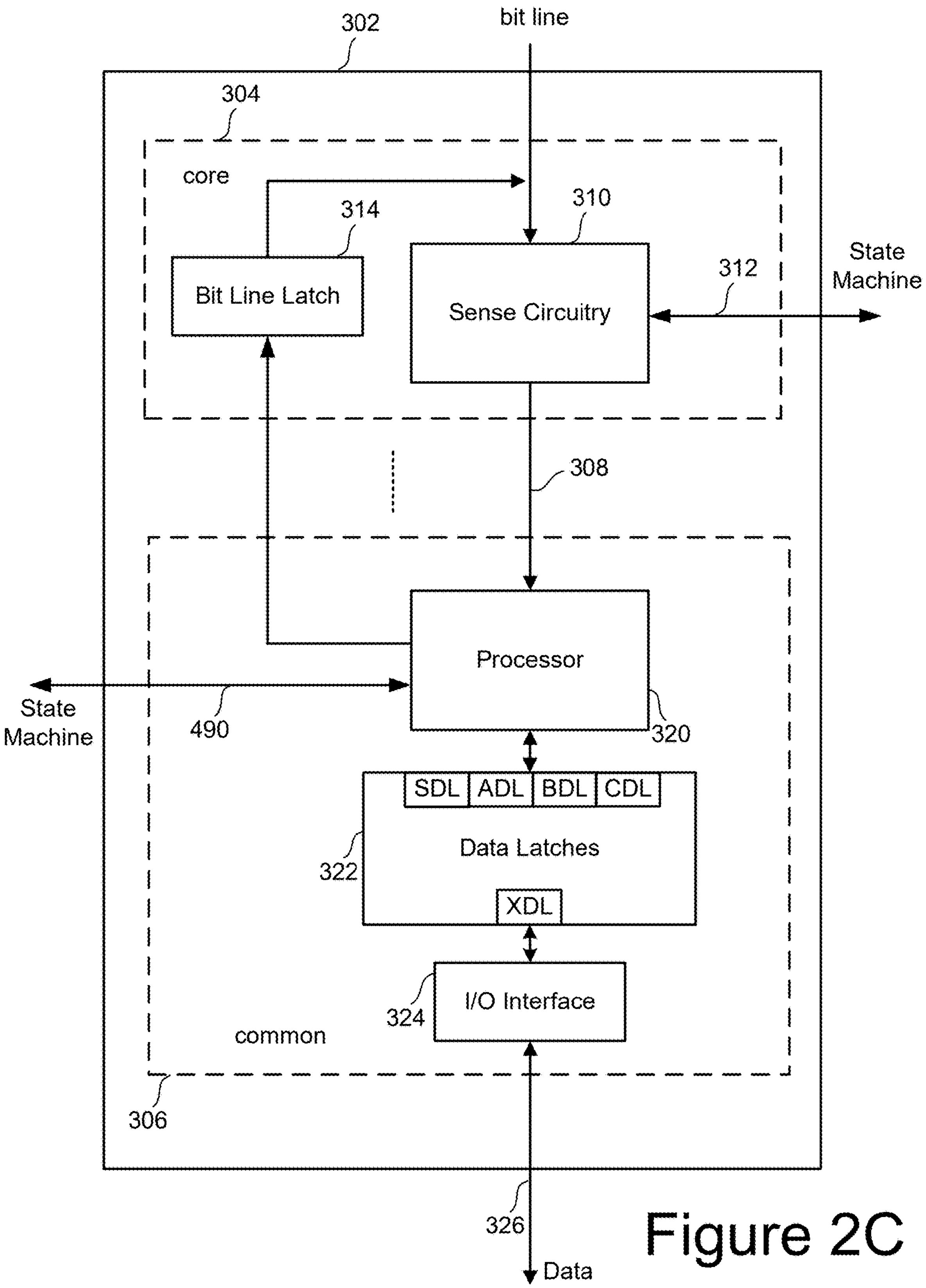
FIG. 2C depicts details of an individual sense block.

FIG. 2C is a block diagram depicting an individual sense block 302 of sense amplifiers 230 partitioned into a core portion 304 (referred to as a sense module 304) and a common portion 306. In one embodiment, there will be a separate sense module 304 for each bit line and one common portion 306 for a set of multiple sense modules 304. In one example, a sense block 302 will include one common portion 306 connected to eight, twelve, or sixteen sense modules 304. Each of the sense modules 304 in a group will communicate with the associated common portion 306 via a data bus 308. In one embodiment, sense amplifiers 230 will include many sense blocks 302.

Sense module 304 comprises sense circuitry 310 that determines whether a conduction current in a connected bit line is above or below a predetermined level or, in voltage based sensing, whether a voltage level in a connected bit line is above or below a predetermined level. The sense circuitry 310 is to receive control signals from the state machine via input lines 312. In some embodiments, sense circuitry 310 includes a circuit commonly referred to as a sense amplifier. Sense module 304 also includes a bit line latch 314 that is used to set a voltage condition on the connected bit line. For example, a predetermined state latched in bit line latch 314 will result in the connected bit line being pulled to a state designating program inhibit (e.g., VDD).

Common portion 306 comprises a processor 320, data latches 322 and an I/O Interface 324 coupled between the set of data latches 322 and data bus 326. Processor 320 performs computations. For example, one of its functions is to determine the data stored in the sensed memory cell and store the determined data in the set of data latches. The set of data latches 322 is used to store data bits determined by processor 320 during a read operation. It is also used to store data bits imported from the data bus 326 during a program operation. The imported data bits represent write data meant to be programmed into the memory. I/O interface 324 provides an interface between data latches 322 and the data bus 326.

During read or sensing, the operation of the system is under the control of state machine 262 that controls (using power control 264) the supply of different control gate or other bias voltages to the addressed memory cell(s). As it steps through the various predefined control gate voltages corresponding to the various memory states supported by the memory, the sense module 304 may trip at one of these voltages and an output will be provided from sense module 304 to processor 320 via bus 308. At that point, processor 320 determines the resultant memory state by consideration of the tripping event(s) of the sense module 304 and the information about the applied control gate voltage from the state machine via signal lines 490. It then computes a binary encoding for the memory state and stores the resultant data bits into data latches 322. In another embodiment, bit line latch 314 serves double duty, both as a latch for latching the output of the sense module 304 and also as a bit line latch as described above.

Data latch stack 322 contains a stack of data latches corresponding to an associated sense module 304. In one embodiment, there are three, four or another number of data latches per sense module 304. In one embodiment, the latches are each one bit (e.g., one bit per sense module 304). In one embodiment, the latches for each sense module 304 will be referred to as SDL, XDL, ADL, BDL, and CDL. Thus, in one embodiment, each sense module 304 has its own set of SDL, XDL, ADL, BDL, and CDL. In the embodiments discussed here, the latch XDL is a transfer latch used to exchange data with the I/O interface 324. In addition to a first sense amplifier data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In a 2-bit per cell embodiment, only ADL and BDL might be used, while a 4-bit per cell embodiment might include a further set of DDL latches. In other embodiments, the XDL latches can be used to hold additional pages of data, such as a 4-bit per cell MLC embodiment that uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per memory cell formats. In embodiments discussed below, the latches ADL, BDL, CDL, SDL and XDL can transfer data between themselves and the bit line latch 324.

In some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 322 from the data bus 326. During the verify process, Processor 320 monitors the verified memory state relative to the desired memory state. When the two are in agreement, processor 320 sets the bit line latch 314 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 326, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
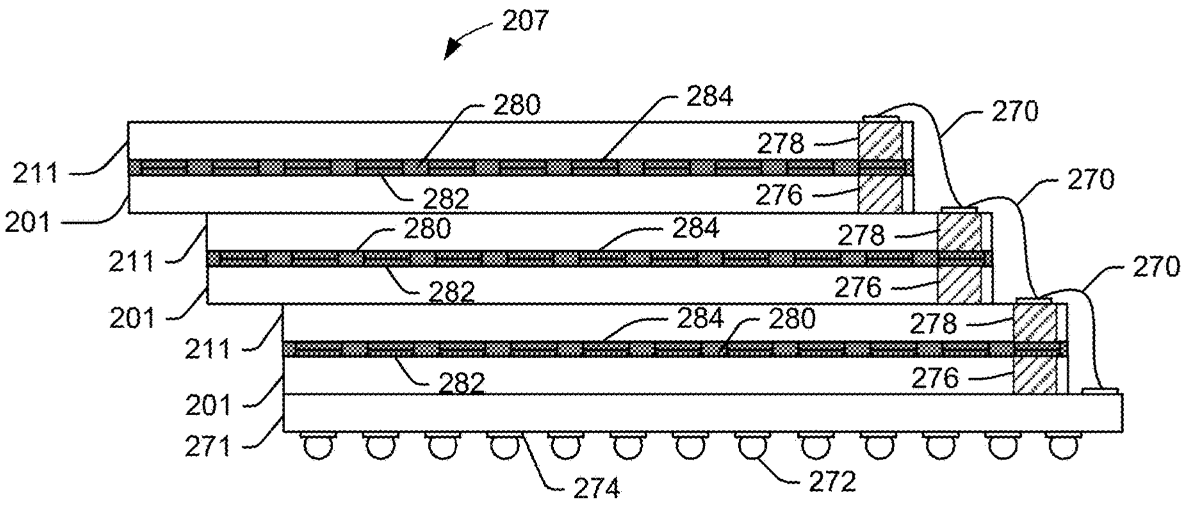
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
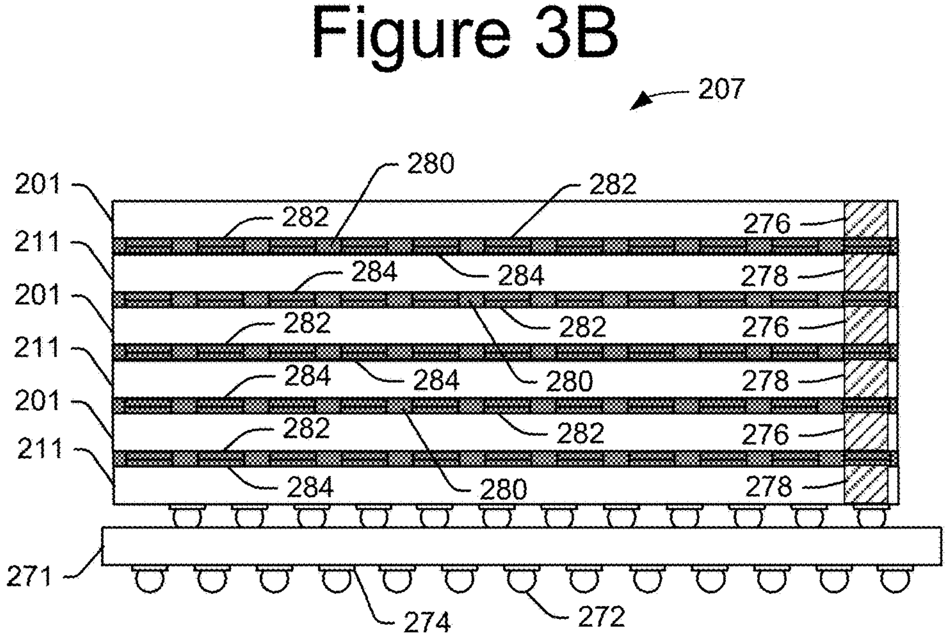

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
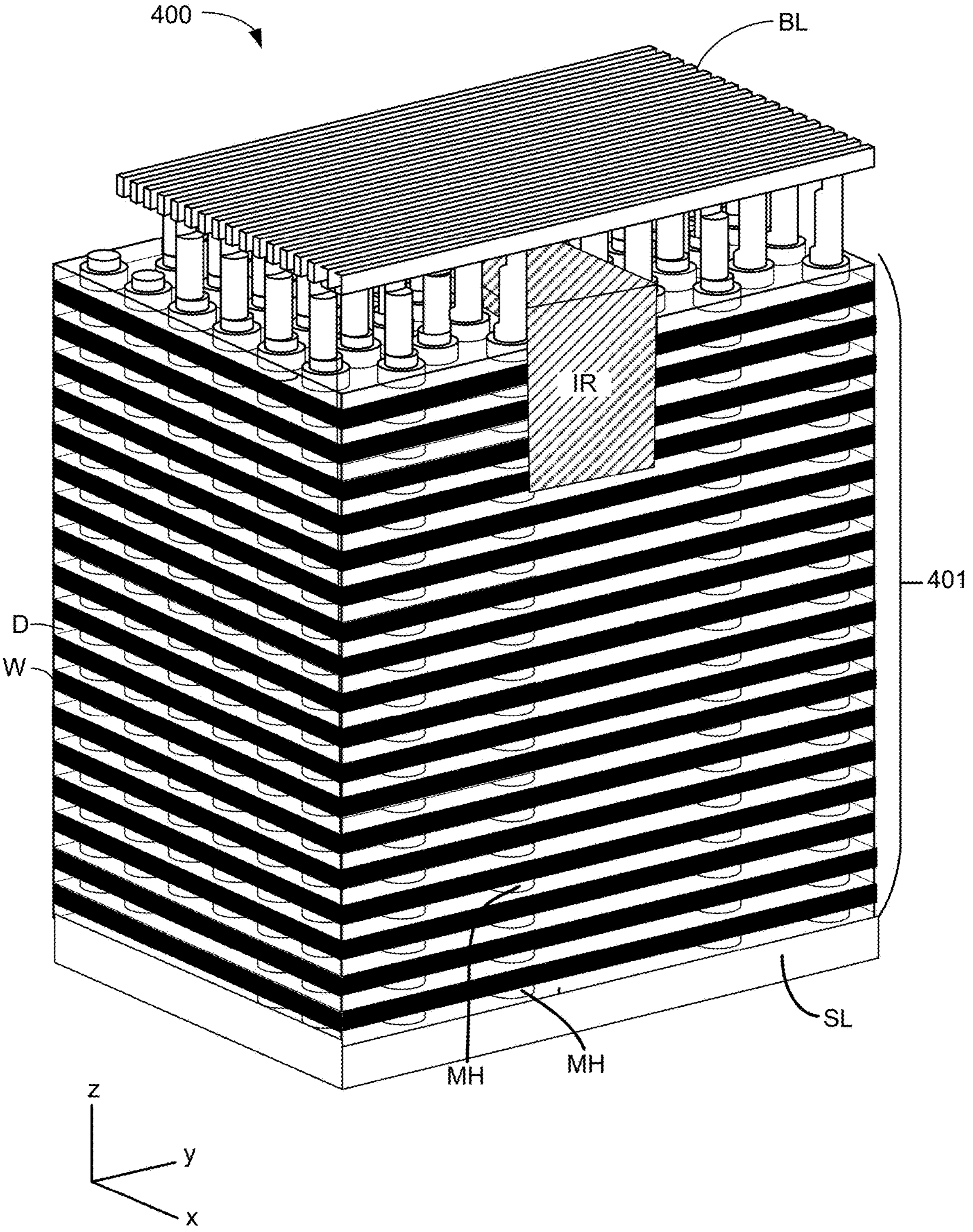
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
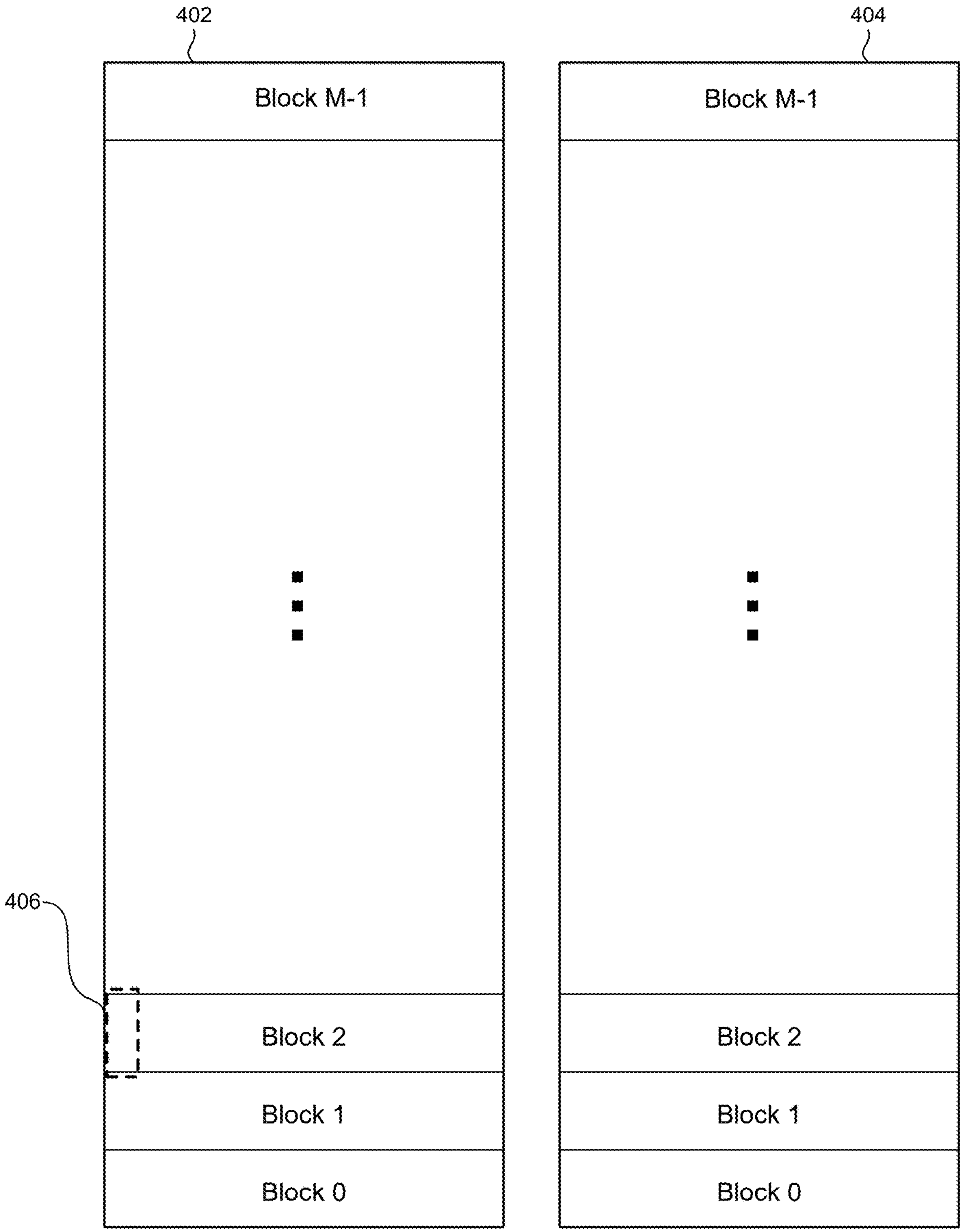
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
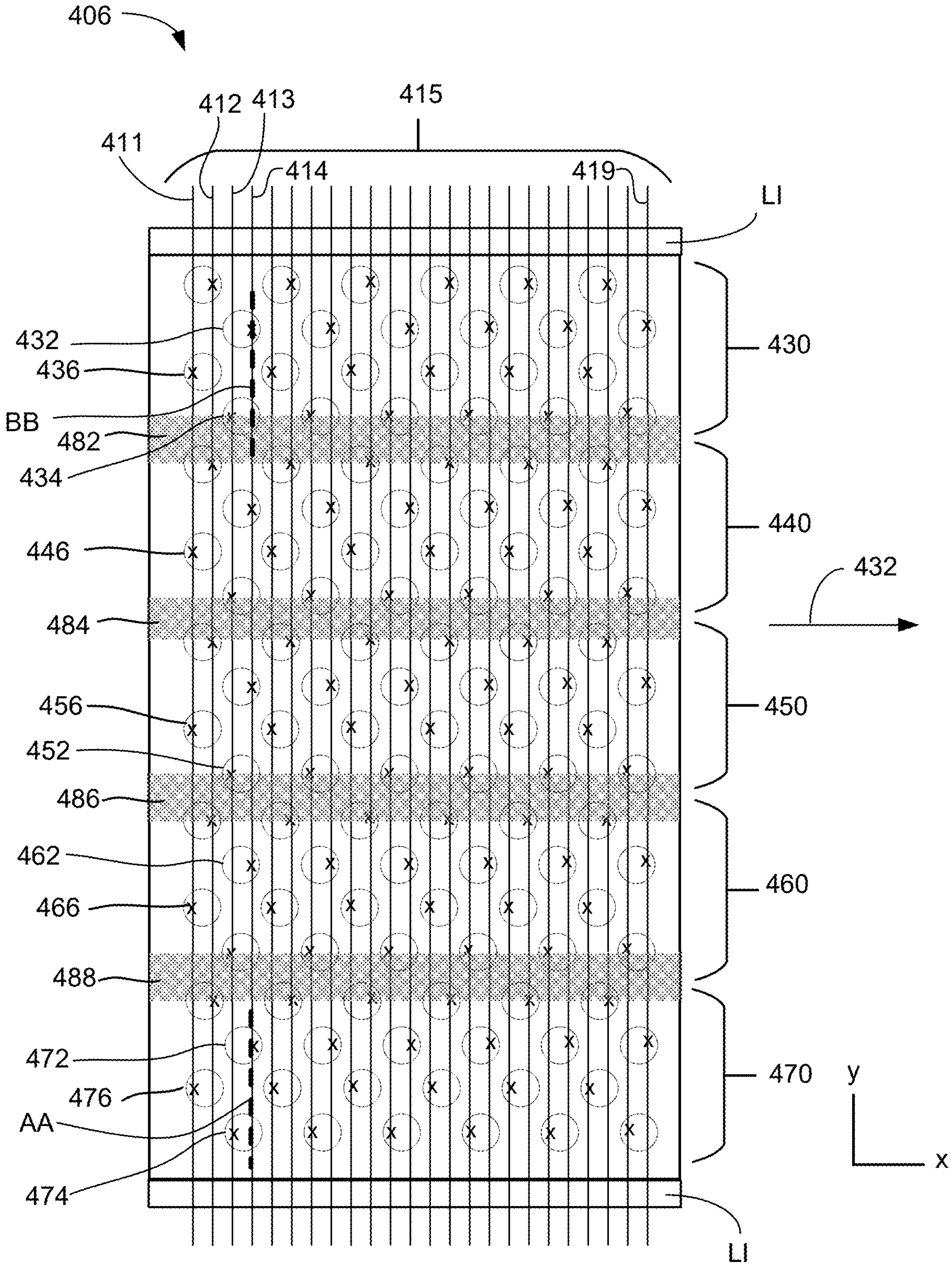
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side select lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
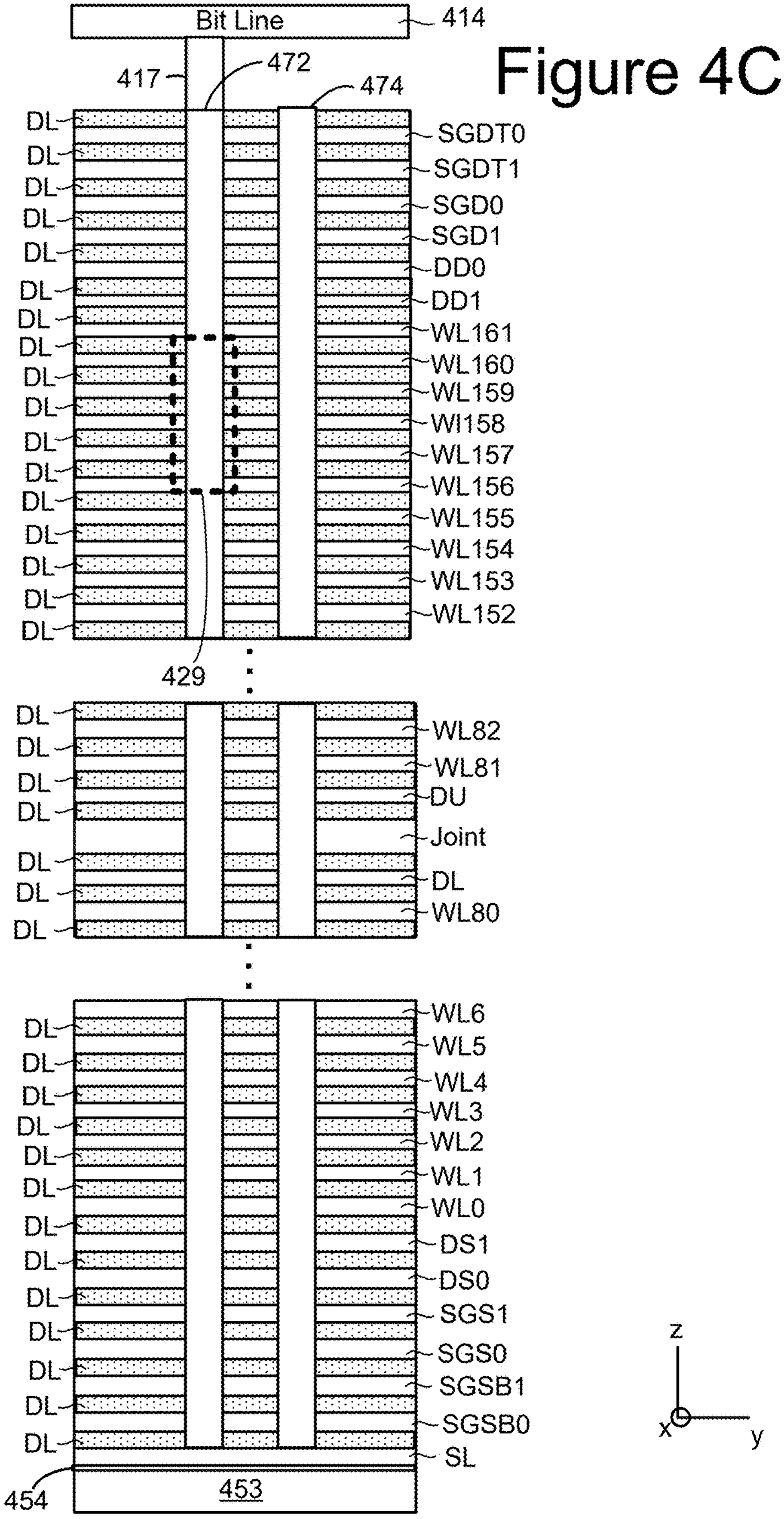
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD; two source side select layers SGS0 and SGS1; two drain side gate induced drain leakage (GIDL) generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt p-n junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
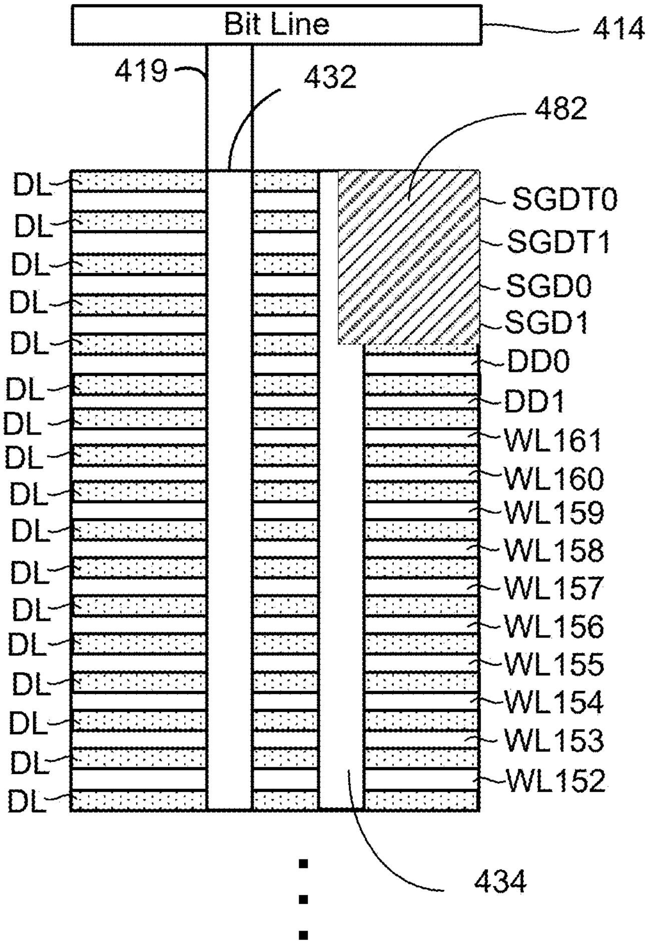
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
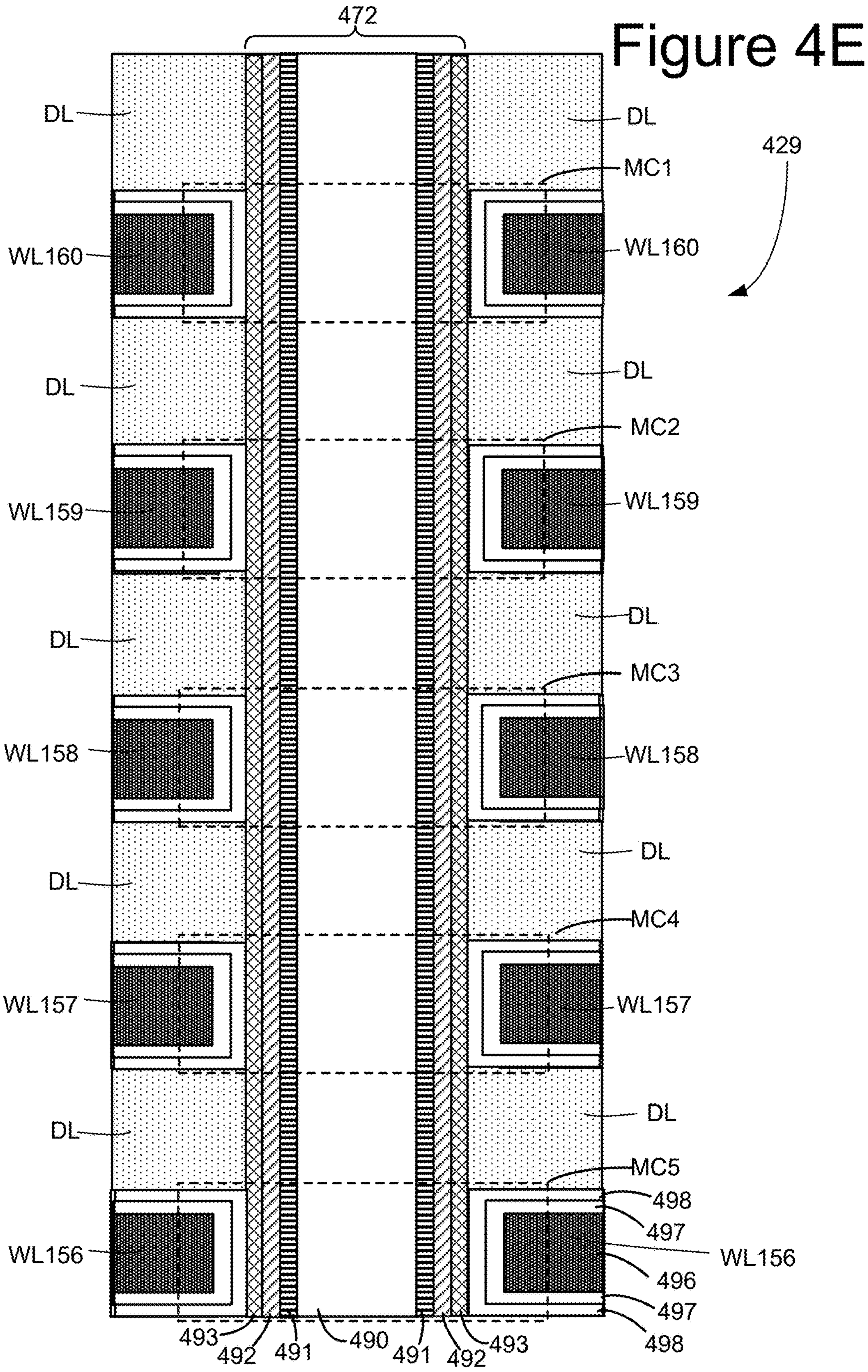
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
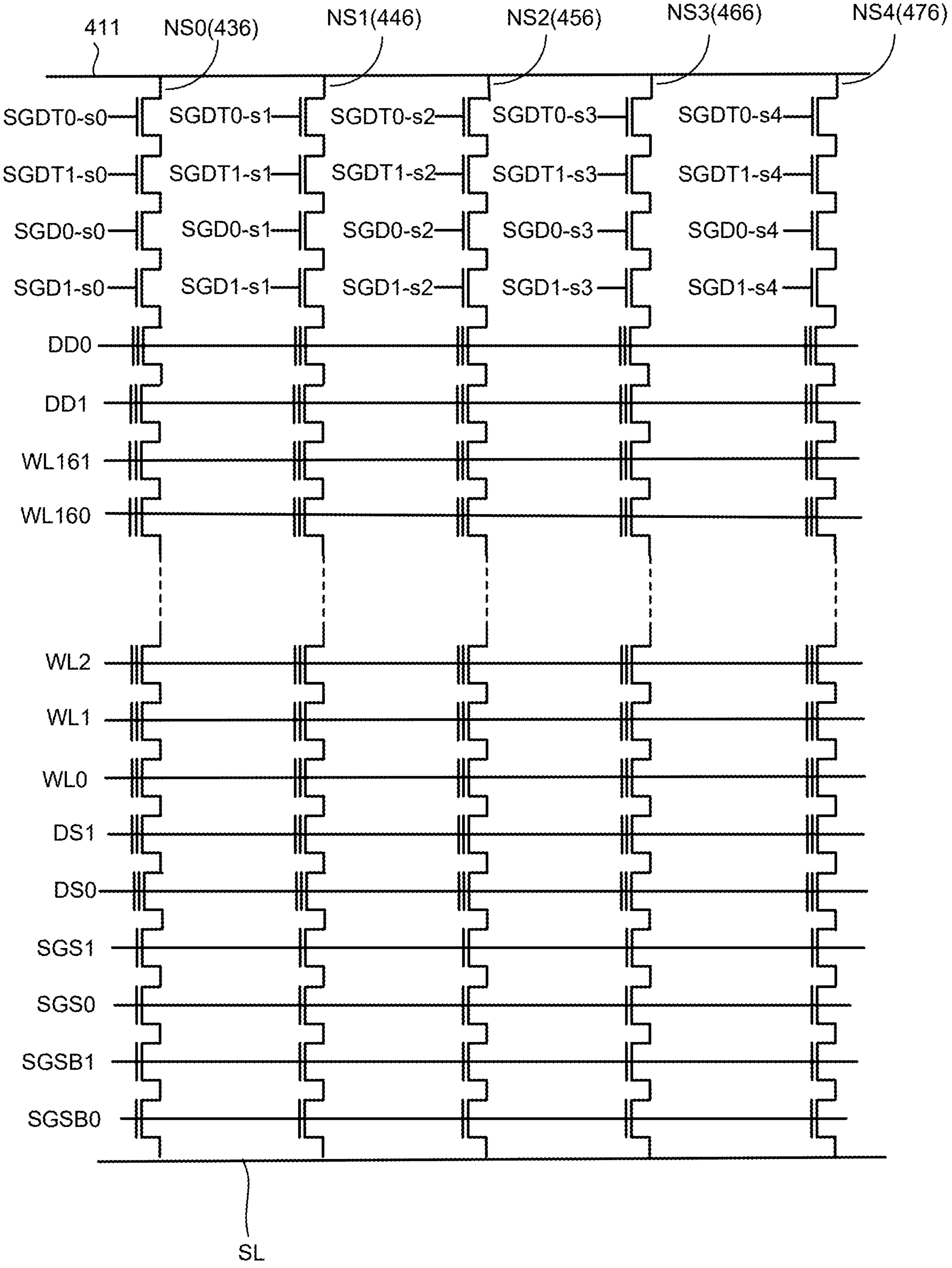
FIG. 4F is a schematic of a plurality of NAND strings in multiple regions of a same block.

FIG. 4F is a schematic diagram of a portion of the three dimensional memory array 202 depicted in in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions isolation regions 482, 484, 486 and 488 to form SGD0-*s*0, SGD0-*s*1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
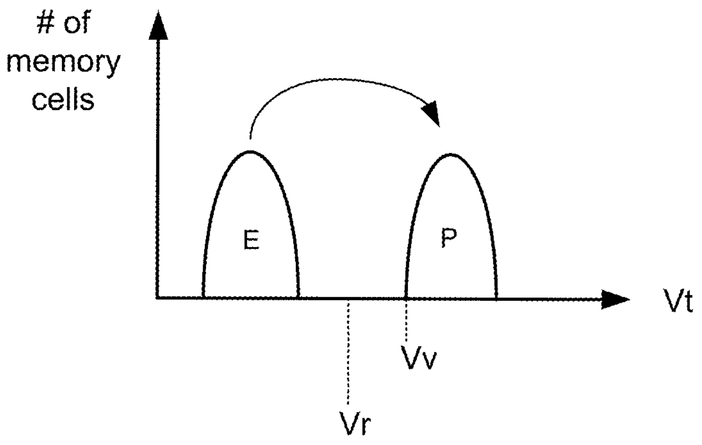
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
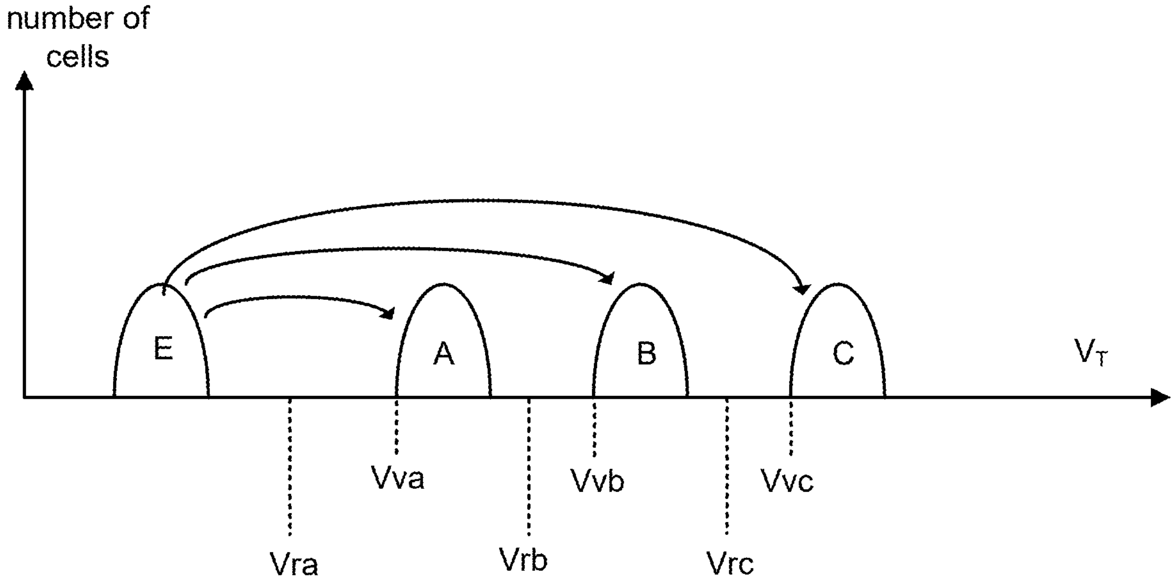
FIG. 5B depicts threshold voltage distributions.
Figure 5C:
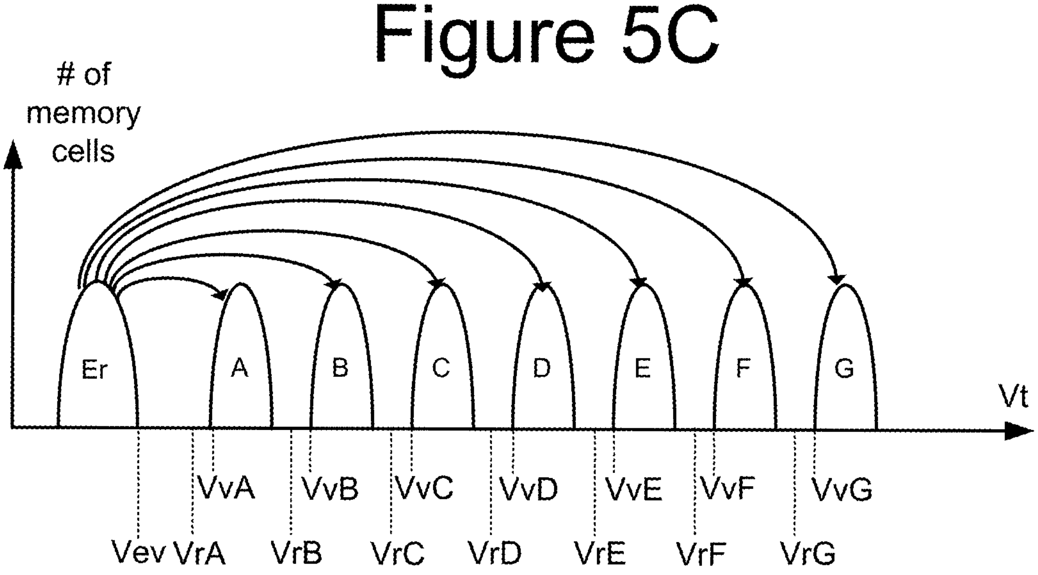
FIG. 5C depicts threshold voltage distributions.
Figure 5D:
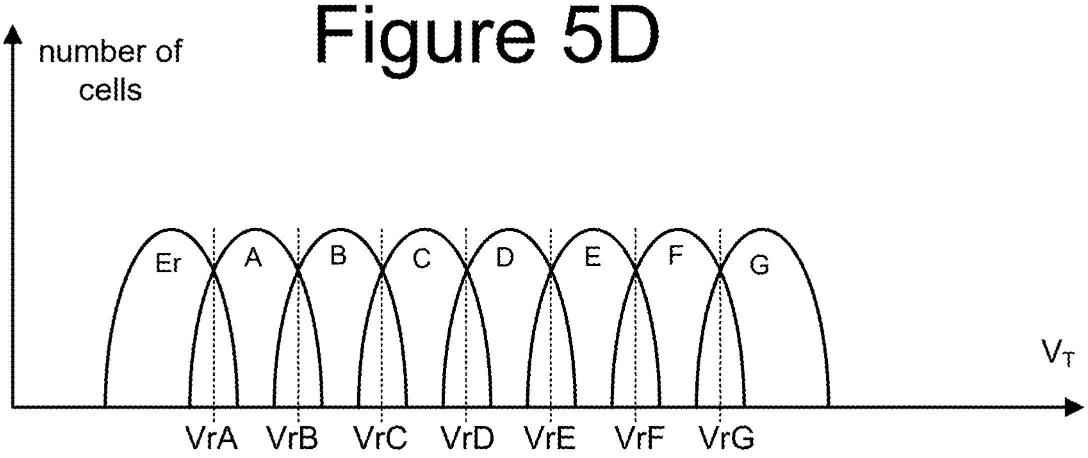
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5C shows no overlap between threshold voltage distributions. FIG. 5D depicts an embodiment where each memory cell stores three bits of data per memory cells and the threshold voltage distributions overlap with one or more neighboring threshold voltage distributions. For example, the threshold voltage distribution for data state B overlaps with the threshold voltage distributions for data states A and C. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities.

Figure 5E:
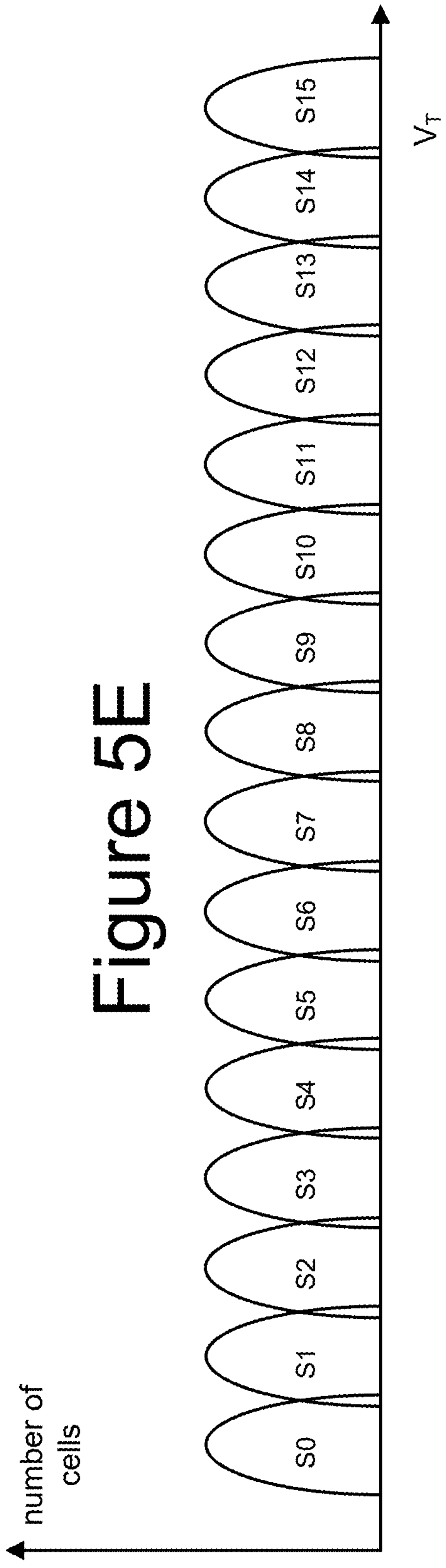
FIG. 5E depicts threshold voltage distributions.

FIG. 5E depicts threshold voltage distributions when each memory cell stores four bits of data, which is another example of MLC data. FIG. 5E depicts that there may be some overlap between the threshold voltage distributions (data states) S0-S15. The threshold voltage distributions of FIG. 5D will include read reference voltages and verify reference voltages, as discussed above. FIG. 5E shows the threshold voltage distributions overlap with one or more neighboring threshold voltage distributions; however, in some embodiments the threshold voltage distributions for a population of memory cells storing four bits of data per memory cell do not overlap and are separated from each other.

When using four bits per memory cell, the memory can be programmed using the full sequence programming discussed above, or multi-pass programming processes known in the art. Each threshold voltage distribution of FIG. 5E corresponds to a data state (S0-S15) and predetermined values for the set of data bits. The specific relationship between the data programmed into the memory cell and the threshold voltage levels of the memory cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
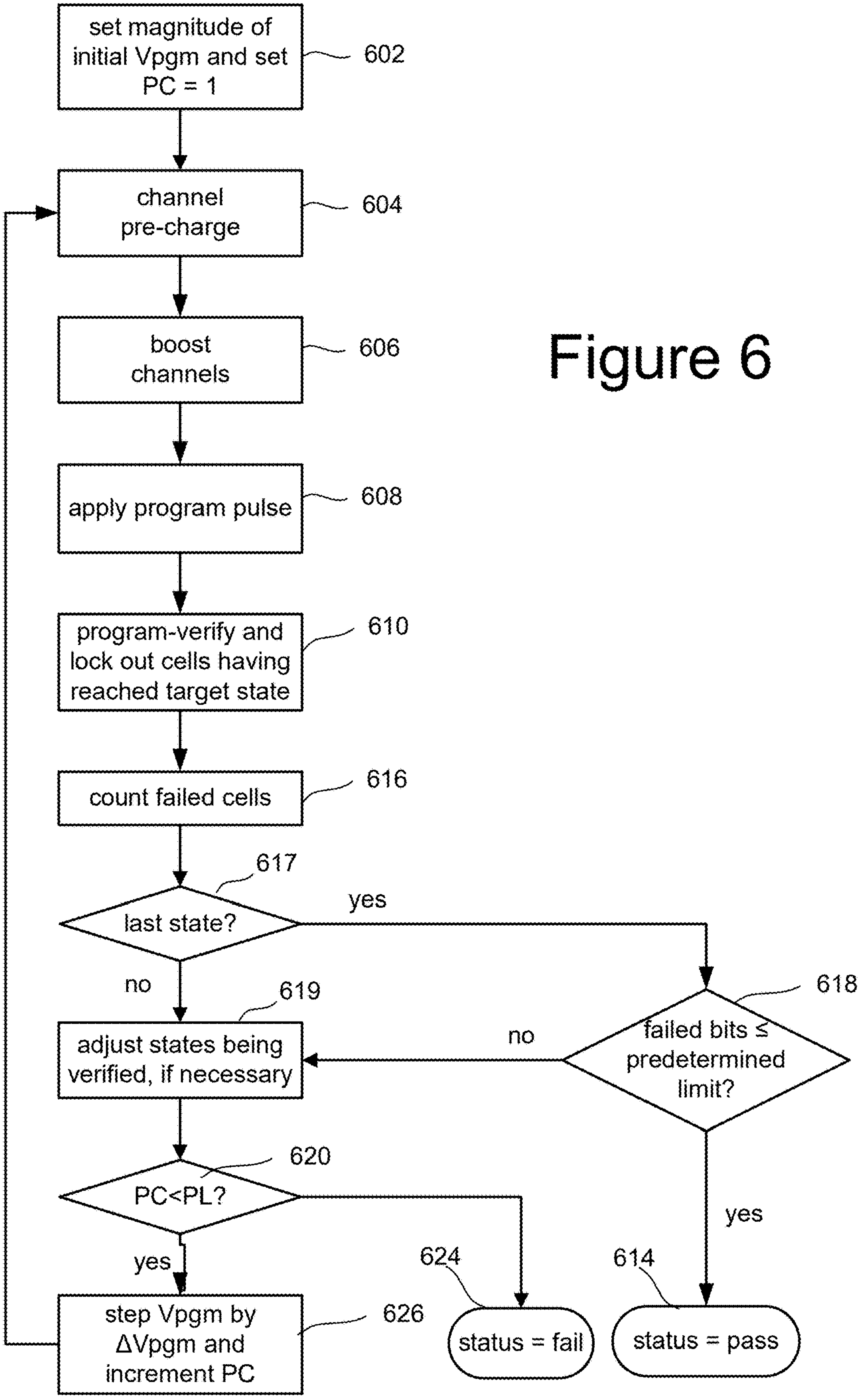
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vth) that the memory cell has reached its target state.

In one embodiment of step 610, a smart verify technique is used such that the system only verifies a subset of data states during a program loop (steps 604-628). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vth) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
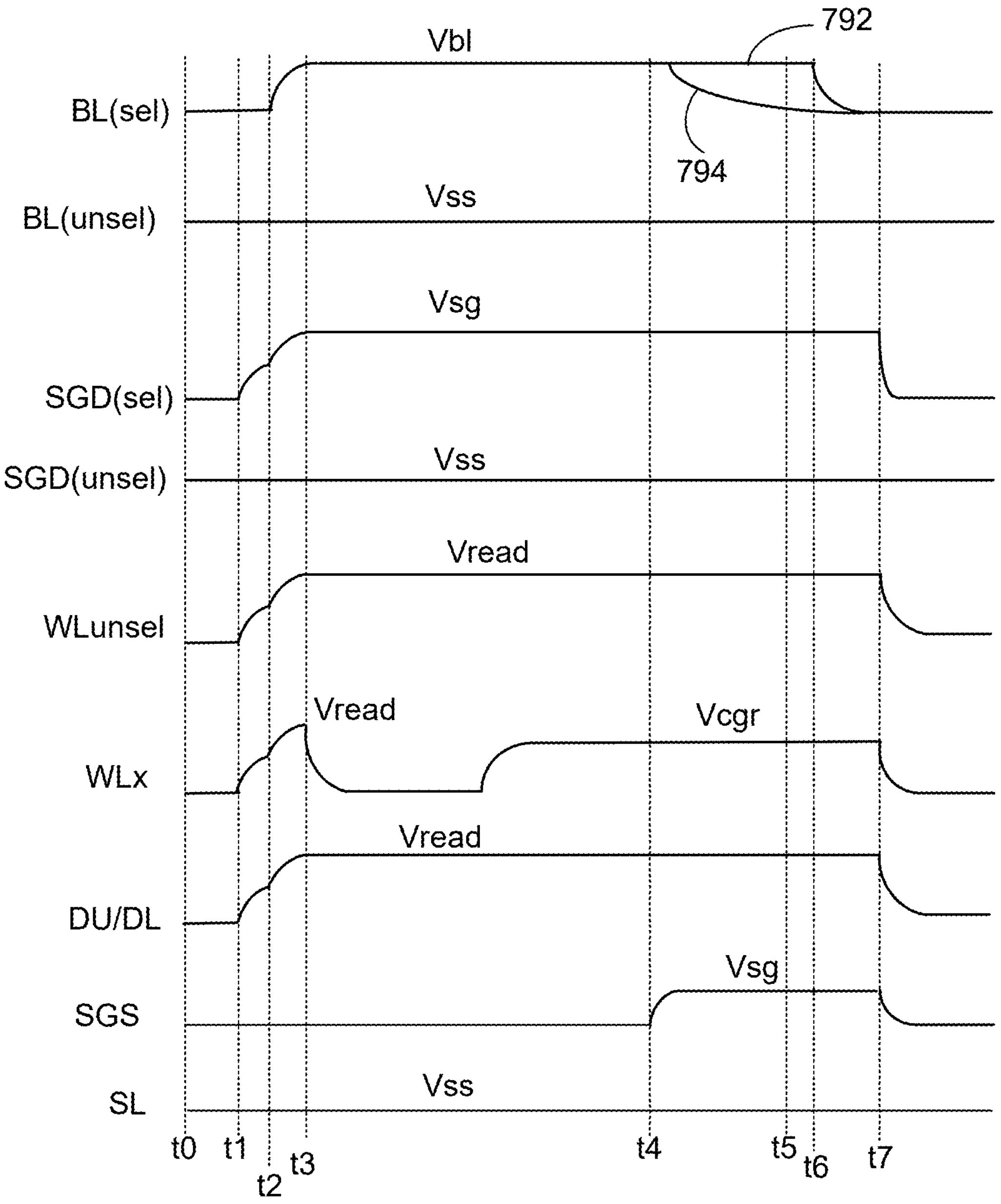
FIG. 7 is a timing diagram describing one embodiment of a read operation.

FIG. 7 is a timing diagram depicting the behavior of various signals when sensing data during a read operation or a program verify operation. FIG. 7 depicts the following signals: BL(sel), BL(unsel), SGD(sel), SGD(unsel), WLunsel, WLx, DU/DL, SGS and SL. The signal BL(sel) is the voltage applied to bit lines connected to NAND strings having memory cells selected for reading. The signal BL(unsel) is the voltage applied to bit lines connected to NAND strings that do not have any memory cells selected for reading. The signal SGD(sel) is the voltage applied to the drain side select (SGD) lines (e.g., SGD0 and SGD1 connected together for one region) for the region (e.g., regions 430, 440, 450, 460 and 470) selected for programming. The signal SGD(unsel) is the voltage applied to the drain side select (SGD) lines (e.g., SGD0 and SGD1 connected together for one region) for the regions (e.g., regions 430, 440, 450, 460 and 470) not selected for programming. The signal WLx is the voltage applied to the word line selected for reading/verifying. The signal WLunsel is the voltage applied to the word lines not selected for reading. DU/DL is the signal applied to the dummy word lines DU and DL, which are adjacent to the Joint area. SGS is the source side select lines (e.g., SGS0 and SGS1 connected together for one region). SL is the source line.

At time t0 of FIG. 7, all signals depicted in FIG. 7 are at Vss (ground or 0 volts). At time t1, SGD(sel), WLunsel, WLx and DU/DL are raised to Vdd (e.g., ~3 volts) as part of a step process of ramping up to target voltages. At time t2, BL(sel) is raised to Vbl (e.g., 0.5-1.5 v). Also at time t2, DU/DL, WLx and WLunsel are raised from Vdd to Vread (e.g., 6-8 volts). Vread is an example of an overdrive voltage because it is high enough to turn on the memory cell regardless of which data state the memory cell has been programmed to. Vpass (used during programming) is another example of an overdrive voltage. Other overdrive voltages can also be used. Also at time t2, SGD(sel) is raised from Vdd to Vsg (e.g., 3.5-6 v), an example of a sense enabling voltage. At t3, WLx is lowered back to ground. WLx is subsequently raised to Vcgr (e.g., one of the read reference voltages VrA, VrB, VrC, VrD, VrE, VrF, and VrG of FIG. 5C) between t3 and t4 . . . . If the system is performing a verify operation than Vcgr is one of the verify reference voltages (e.g., VvA, VvB, VvC, VvD, VVE, VVF, and VvG of FIG. 5C) applied to WLx. When performing erase verify, Vev (see FIG. 5C) can be applied. At time t4, SGS is raised to Vsg, which provides a path for the bit line voltage to dissipate. If Vcgr is greater than the threshold voltage of the selected memory cells, then the selected memory cells will conduct current and the bit line voltage will dissipate via the source line, as depicted by curve 794. If Vcgr is not greater than the threshold voltage of the selected memory cells, then the selected memory cells will not conduct current and the bit line voltage will not dissipate via the source line, as depicted by curve 792. The sense amplifiers will sense whether the selected memory cell conducted or not at time t5. At time t6, BL(sel) is lowered to Vss. At time t7, SGD(sel), WLunsel, WLx, and SGS are lowered to Vss. When sensing at t5, the results of the sensing are stored in a latch at the respective sense amplifier. Afterwards, the system (e.g., control circuit) scans all of the latches of the sense amplifiers to determine which memory cells conducted and which did not conduct.

Memory systems often use Error Correction Codes (ECC) to protect data from corruption. Many ECC coding schemes are well known in the art. These conventional error correction codes are useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits. As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular read parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, Memory Controller 120 receives host data, also referred to as information bits, that is to be stored in memory cells of non-volatile three dimensional memory structure 202. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in non-volatile three dimensional memory structure 202 by programming one or more memory cells to one or more data states, which corresponds to v.

When reading data that has been encoded by error correction codes, the code words v read from the memory cells using the process of FIG. 7 need to be decoded back to the original data i. In one possible implementation, an iterative probabilistic decoding process is used which implements error correction decoding corresponding to the encoding implemented in Memory Controller 120 (or on control die 211). Further details regarding iterative probabilistic decoding can be found in the above-mentioned D. Mackay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios (LLRs) which are obtained from LLR tables. LLR values are measures of the reliability with which the values of various binary bits read from the storage elements are known.

The LLR for a bit is given by $Q=\log_2\{P(v=0|Y)/P(v=1|Y)\}$, where $P(v=0|Y)$ is the probability that a bit is a 0 given the condition that the state read is Y, and $P(v=1|Y)$ is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Memory Controller 120 (and/or control die 211) receives the code word Y and the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. The flipping of bits can be thought of as correcting a bit or correcting an error in the data sensed from the memory cells. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y is completed to obtain the decoded information including parity bits v and the decoded information bits i.

It is hoped that the above-described decoding process results in all parity checks being satisfied, meaning that the decoding process converged on error free data, which is then returned to the host. However, it is possible that the code words sensed from the memory cells have too many errors for the ECC process to correct. In that case, the data is deemed uncorrectable and an error message (without the data) is returned to the host indicating that the read process has failed and was unsuccessful.

Figure 8:
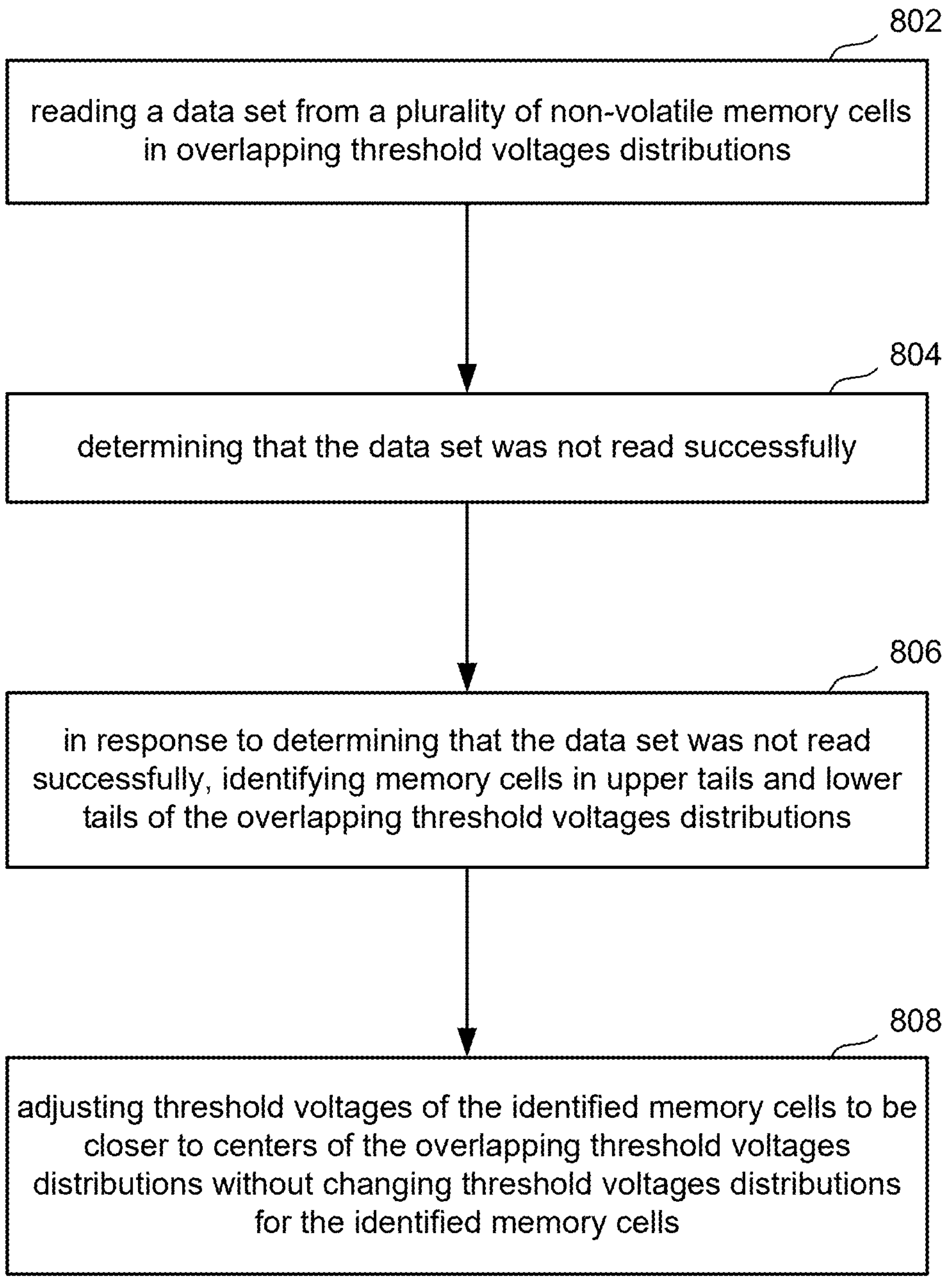
FIG. 8 is a flow chart describing on embodiment of a process for reading.

FIG. 8 is a flow chart describing on embodiment of a process for reading data that is able to recover data when the standard read process has failed because the code words sensed from the memory cells have too many errors for the ECC process to correct. In some example implementations, the process of FIG. 8 can be performed by any one of the one or more control circuits discussed above. The process of FIG. 8 can be performed entirely by a control circuit on memory die 200 (see FIG. 2A) or entirely by a control circuit on integrated memory assembly 207 (see FIG. 2B), rather than by memory controller 120. In one example, the process of FIG. 8 is performed by or at the direction of state machine 262, using other components of System Control Logic 260, Column Control Circuitry 210 and Row Control Circuitry 220. In another embodiment, the process of FIG. 8 is performed by memory controller 120 in combination with System Control Logic 260, Column Control Circuitry 210 and Row Control Circuitry 220. In some embodiments, the process of FIG. 8 is performed on any of the non-volatile memories discussed above.

In step 802 of FIG. 8, the control circuit reads a data set from a plurality of non-volatile memory cells in overlapping threshold voltages distributions. For example, the process of FIG. 7 will be performed one or more times to sense information from memory cells in the threshold voltage distributions of FIG. 5D for one or more code words and the system attempts to decode the one or more code words (e.g., using ECC Engine 158). In step 804, the control circuit determines that the data set was not read successfully (e.g., because the code words sensed from the memory cells have too many errors for the ECC process to correct). In step 806, the control circuit, in response to determining that the data set was not read successfully, identifies memory cells in upper tails and lower tails of overlapping threshold voltages distributions. In one embodiment, the control circuit identifies memory cells that are storing error bits from the code words having too many errors and that are in upper tails or lower tails of overlapping threshold voltages distributions. In step 808, the control circuit adjusts threshold voltages of the identified memory cells (identified in step 806) to be closer to centers of the overlapping threshold voltages distributions without changing threshold voltages distributions for the identified memory cells being adjusted. More details of steps 806 and 808 will be discussed below.

Referring back now to FIGS. 4C, 4D, and 4F, each NAND string has one or more select gates at either end, with the example embodiments above include two select gates SGD0, SGD1 at the drain end and two select gates SGS0, SGS1 at the source end to provide the NAND selection function. These embodiments also include an outer pair of select gates SGDT0, SGDT1 and SGST0, SGST1 at either end to implement the GIDL mechanism. For proper operation of the memory device, these select gates need to have threshold voltages within a well-defined distribution. If the threshold voltage is too high, the select gates may not fully turn on for the select function, and if the threshold voltage Vth is too low, the select gates may not fully turn off for the deselect or will decrease the GIDL function. Even if a select gate is correctly programmed when a device is fresh, over time the Vth value can drift due to disturb mechanisms.

One approach to select gate with bad Vth values is through a tail detection read at the end of an erase operation to catch lower tail and upper tail issues for select gates. In one set of embodiments, a tail detection read mode is triggered after erase verify pass, with a read executed on select gates with a predetermined read level and the number of select transistors below and above the reference level is counted. If the number of cells exceed a threshold number, which can be predefined or a settable parameter, an erase status failure is issued to indicate the presence of an abnormal select gate Vth distribution. Although this technique has been developed for long time, the TDR mode has not been implemented in field operation. Because, it will result in an erase time penalty (of ~10%, for example), less improvement in defect numbers (as expressed in defective parts per million, or DPPM), and high block overkill.

As memory density of NAND devices continues to increase, the presence of an Vth upper tail for the GIDL layers (i.e., SGDT and SGSB transistors) has become a critical problem, which can cause erase failures due to grown bad blocks or uncorrectable ECC results, which in turn could become a DPPM issue due to multiple WL data loss in the worst case. Therefore, this issue has raised big concerns during device testing, such DPPM qualification or even in customer usage. GIDL layer upper tail issues can be caused by processing difficulties, related to buried (i.e., in the substrate) source line (BSL) structures.

One process related root cause for a Vth upper tail for the SGDT and SGSB layers can be related to the fabrication of the conductive layers for these select gates, such as defects in the contacts between the conductive layers and the corresponding control circuitry (e.g., drivers) or missing conductive material when forming the layer. The bias on such open SGDT/SGSB layers will be coupled up during erase so that the will not contribute to the GIDL mechanism and leading to electron trapping under the open layers. The cause an SGDT/SGSB Vth upward shift, an issue that usually gets worse with more erase-program cycles.

Another process related root cause for a Vth upper tail for the SGDT and SGSB layers can be caused by insufficient phosphorus diffusion at source/drain regions of the NAND string due to core height or memory hole height process variation. Insufficient phosphorus diffusion reduces the potential gradient between SGDT/SGSB and heavily doped drain/source regions, thus weakening GIDL intensity and reducing erase efficiency. Further, electrons can be trapped at SGDT/SGSB fringe region due to back tunneling, further shifting Vth values upward. The issues also gets worse with more erase-program cycles.

These and other mechanisms that trap electrons under the select gates or their fringe regions cause a SGDT/SGSB Vth upper tail. These effects increase as the number of program-erase cycles increase, as illustrated in FIGS. 9 and 10.

Figure 9:
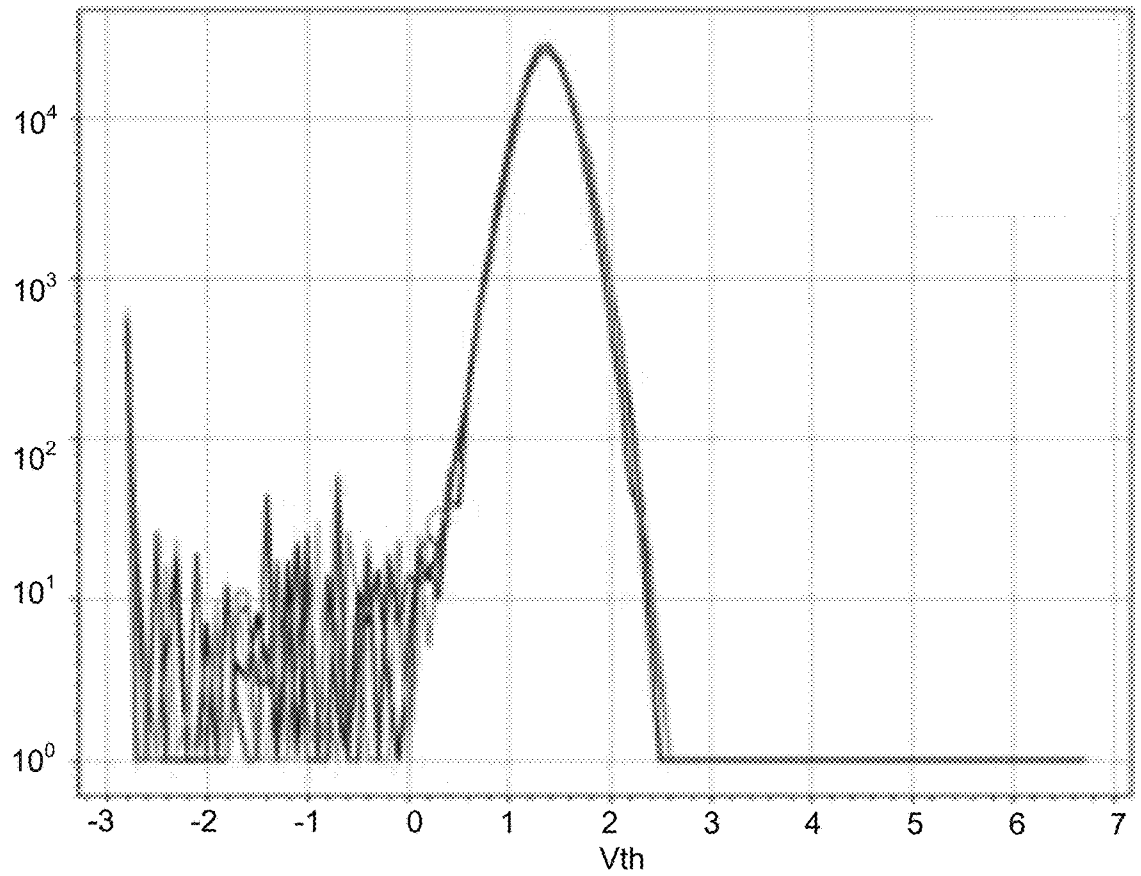
FIGS. 9 and 10 illustrate the distribution of Vth values and failed bit count values respectively for a good block and a bad block.
Figure 9:
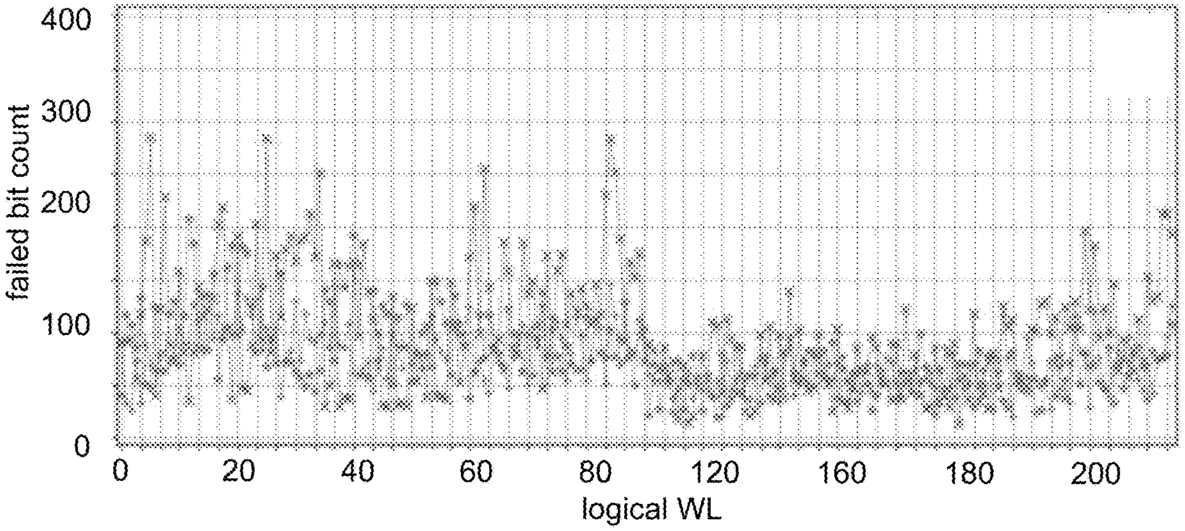
Figure 10:
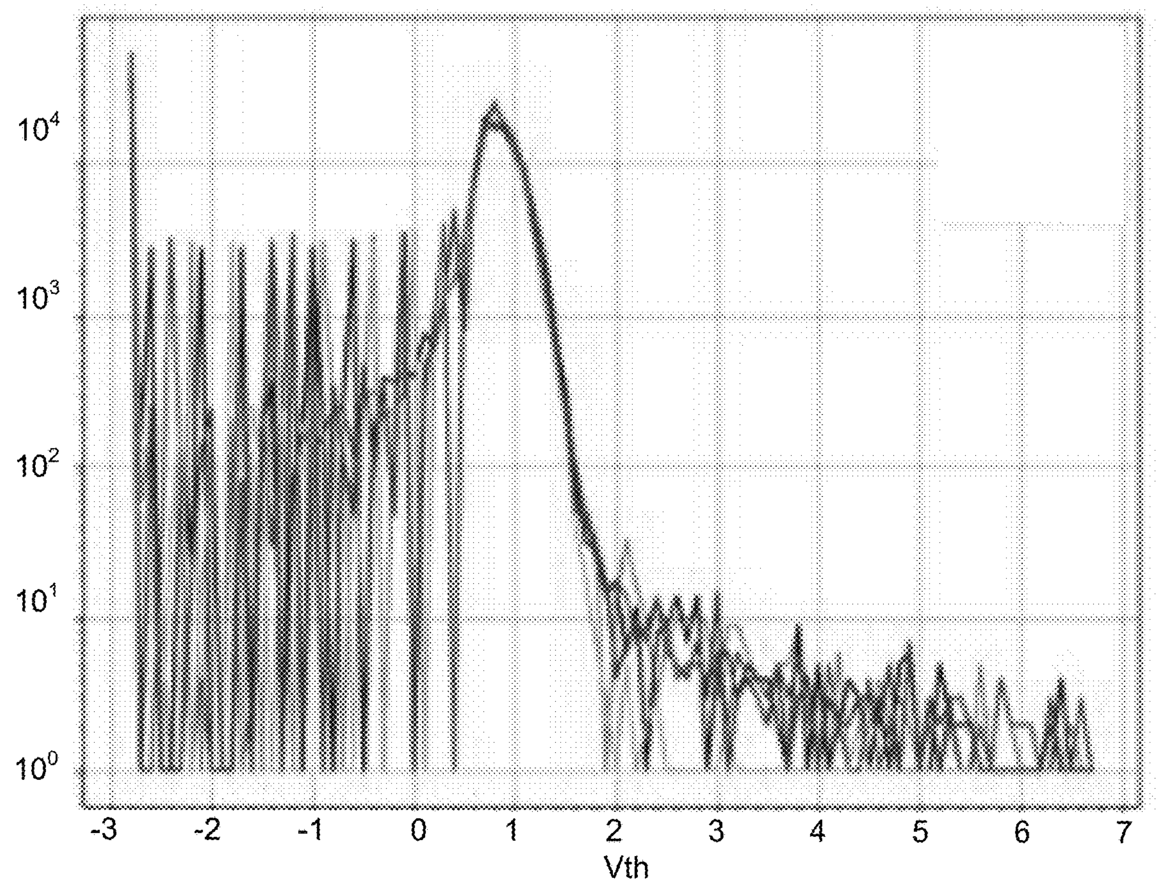
Figure 10:
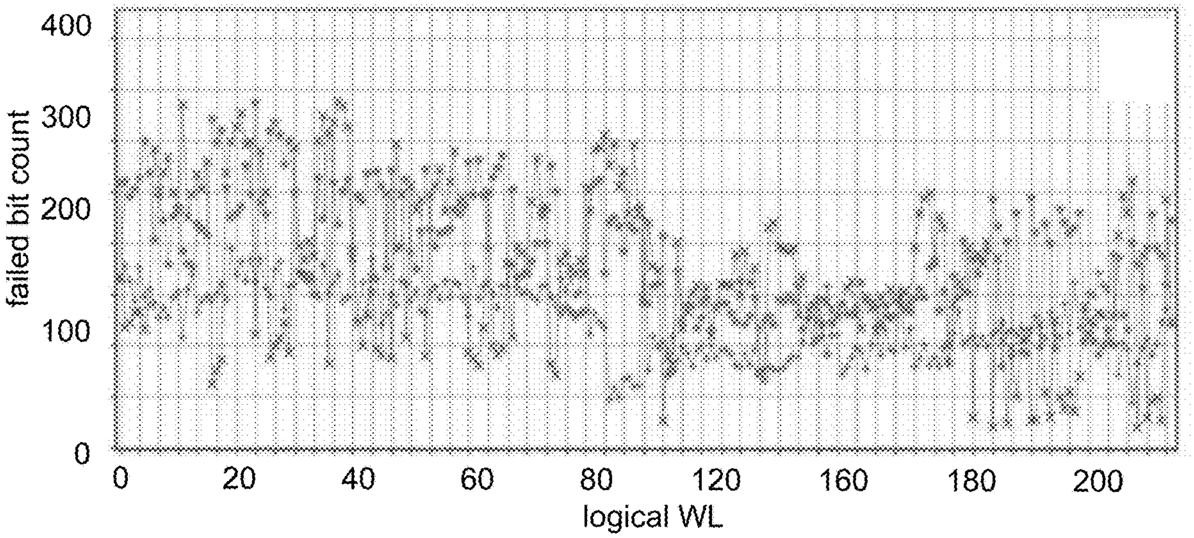

FIGS. 9 and 10 illustrate examples of the distribution of SGDT Vth values and failed bit count values respectively for a good block and a bad block. More specifically, at top figure illustrates an example of the Vth distribution for SGDT transistors of a good block, with the horizontal axis the Vth values and vertical axis the number of transistors in a log scale. The large majority of SGDTs are in the main distribution between ~0V and ~2.5V, with a peak at ~1.25V and can operate properly for both a select and GIDL function. A relatively small number of SGDTs are under-programmed and have low Vth values so that they may not fully shut off when their corresponding bias level is at the off level; however, the SGDTs are mainly designed for GIDL erase operation and the other series connect drain side select gates will still provide this function and, if not, the system is designed to have some tolerance for bad columns. On the right side of the main distribution, a negligible number SGDTs have the sort of high Vth value that would limit the effectiveness of the GIDL mechanism.

At bottom, FIG. 9 shows an example of the number of failed bits for each logical word line, with superimposed plots for each of an upper, middle, and lower page. A few word lines have a page with a failed bit count peak above 200, but the majority are in the 50-150 range for the first half of the word lines and in 25-100 range for the second half. These numbers are typically manageable by ECC techniques. For a good memory block such as illustrated in FIG. 9, the block will typically be erasable by two erase-verify loops.

FIG. 10 repeats the graphs of FIG. 9, but for a bad block, such as may occur after a relatively high number of program-erase cycles. As shown at top, the central distribution has significantly broadened, has a greatly increased number of low Vth transistors, which will reduce the GIDL efficiency, and, with respect to the GIDL mechanism, has acquired a significant number of high, some very high, Vth transistors. For these high Vth transistors, the standard bias levels will not be able to turn on the transistors during the erase verify operation, greatly reducing the effectiveness of the erase process. The resultant failed bit count is, as shown in the lower part of FIG. 10, greatly increased across all word lines relative to the good block case. For a block in this situation, the need number of erase-verify loops would typically be doubled to a value of four (For general case, good block will pass erase with around 2 erase loops).

Due to the weak gate control of the trapped electrons below the gate or in the fringe region of the SGDT transistors, they are very hard to be erased, so the upper tail issue usually gets worse with more program-erase cycles. To catch this issue before it becomes an erase fail grown bad block or causing uncorrectable data loss, a tail detection read operation can be optimized to detect upper tail issue on select gate gates, and particularly for the SGDT and SGSB switches. One approach for such a screen method is to cycle sample blocks with up to some number (e.g., 40k) erase cycles, so that an SGDT/SGSB upper tail of degraded devices can be detected by the select gate Vth screen. However, this screen not only takes long testing time, but also can cause a high yield loss problem for production when large process variation happens. The following presents a "smart" tail detection read process to address this problem. In particular, algorithms presented below present a tail detection read mode that will not cause an increase in erase times for good blocks, so that it can be more easily to be incorporated into customer operation. In one set of embodiments, a smart tail detection read will be triggered when the erase loop count equals to a specified value defined by the tail detection read skip loop after an erase verify fails, so that there is no increase in erase time for good blocks.

As the GIDL layer Vth upper tail issue decreases GIDL erase efficiency, more erase loops are needed for bad blocks compared to good blocks. Usually, good blocks will pass erase with a certain erase loop count (e.g. 2 loops for high performance trims). However, blocks with a GIDL layer Vth upper tail will fail erase verify after these same erase loops due to the decreased GIDL erase efficiency and requires additional erase and erase verify pulses. Thus, if erase verify fails after a certain erase loop, for which most good blocks pass erase verify, the embodiments for a smart tail detection read mode can be triggered to perform an upper tail detection on SGDT/SGSB transistors to judge whether the erase status fail is caused by a GIDL layer upper tail issue. Since this kind of erase verify fail happens for rare cases, erase times will not be impacted for most of good blocks.

For additional flexibility and compatibility, a parameter "SKIPLOOP_TDR" is newly designed to set the number of skipped erase loops to trigger smart tail detection read. The smart tail detection read can trigger on blocks for which the failed erase verify after an erase loop count, ELC, is ELC=SKIPLOOP_TDR+1. For example, setting SKIPLOOP_TDR=1, then the smart TDR will trigger when ELC=SKIPLOOP_TDR+1=2, so that goods blocks which usually pass erase verify with 2 loops will not trigger smart tail detection read. This feature differentiates smart tail detection read from a more traditional tail detection read mode, which is triggered after erase verify pass for all blocks and leads to an erase time penalty for most of good blocks. Additionally, the SKIPLOOP_TDR setting can prevent repeating tail detection read for multiple erase pulses and help ensure that the smart tail detection read detection will only trigger once for erase time saving. If tail detection read fails, an erase status of fail will be returned, so that the block will be retired and prevented from further usage.

Figure 11:
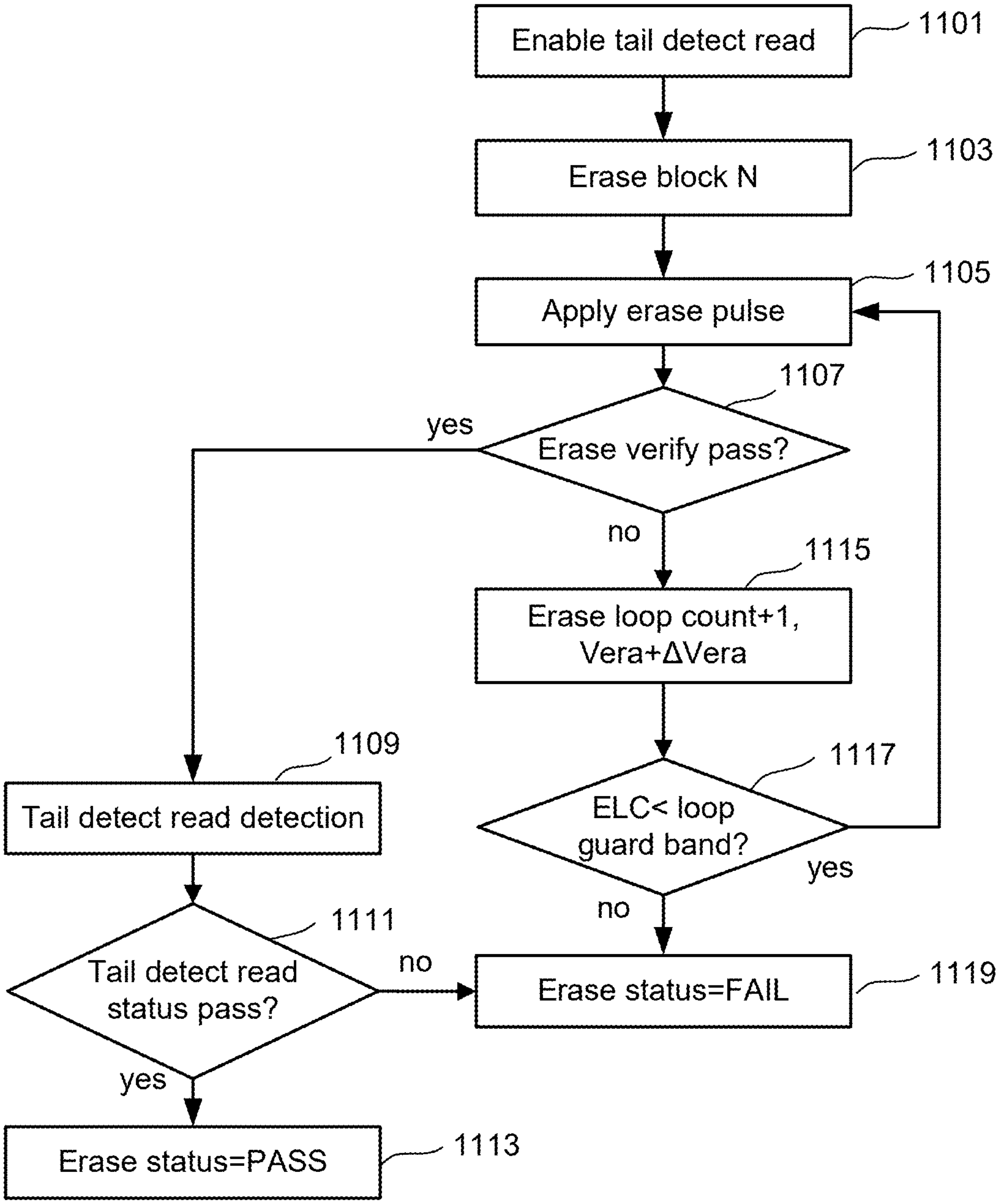
FIGS. 11 and 13 respectively illustrate a more traditional tail detection read and a smart tail detection read embodiment.
Figure 12:
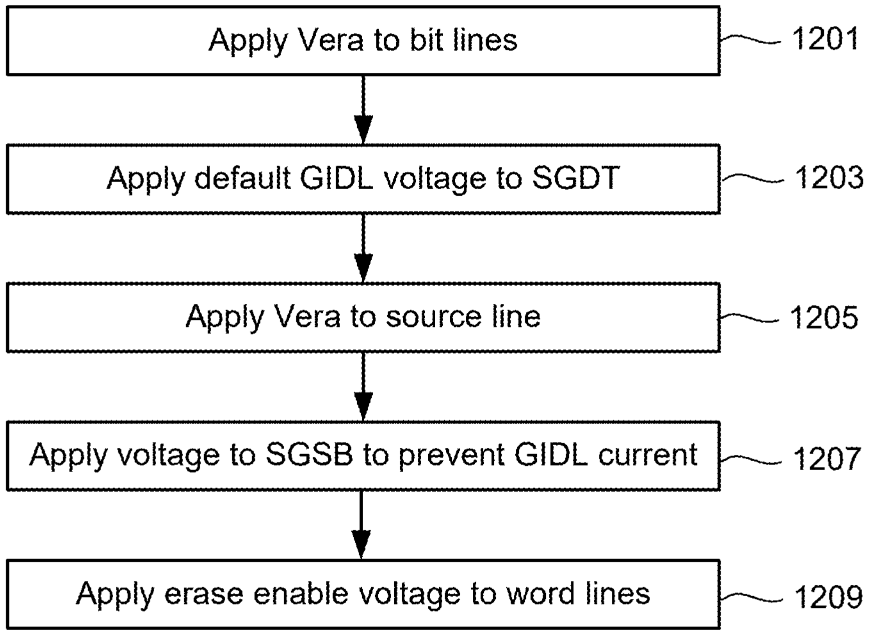
FIG. 12 is a flowchart describing one embodiment of a process for step 1105 for a drain side GDIL erase.
Figure 13:
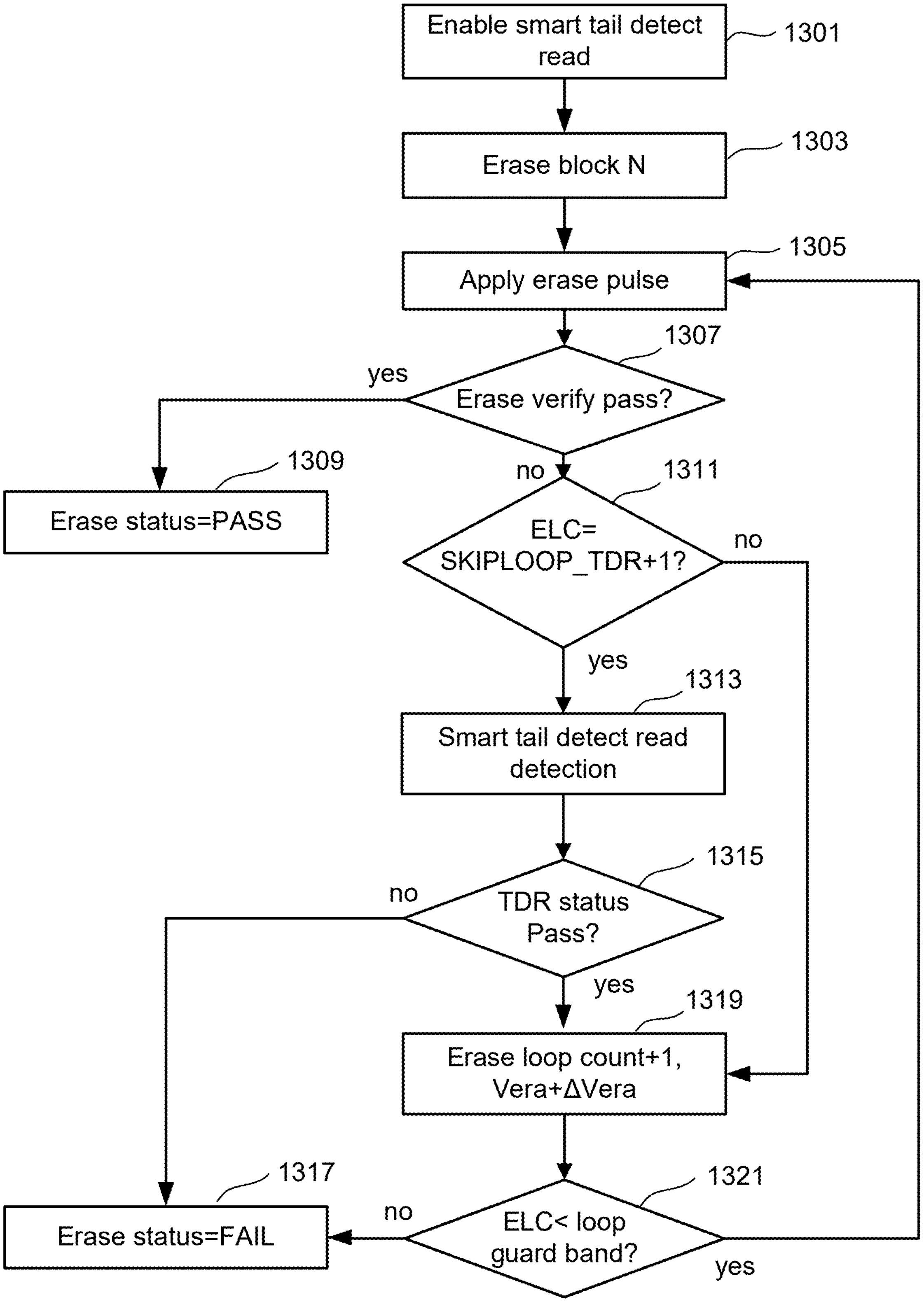

FIGS. 11 and 13 respectively illustrate a more traditional tail detection read and a smart tail detection read embodiment. FIG. 11 begins with tail detection read being enabled at step 1101 and a block N selected for erase at step 1103, where the erase loop count can be initialized at ELC=0 and the erase voltage set to an initial value of Vera. The erase loop starts at step 1105 with application of an erase pulse. FIG. 12 illustrates more detail for an example of step 1105.

FIG. 12 is a flowchart describing one embodiment of a process for step 1105 for a drain side GDIL erase. In an embodiment, circuitry on the die (200, 211) performs process 1000 in response to a command from an off-die control circuit such as memory controller 120. The process for step 1105 may be used to erase a group of NAND strings in a three-dimensional memory structure. The erase in process of FIG. 12 is an example of a gate induced drain leakage erase. A GIDL erase uses a GIDL current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side). The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising the potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells. Thus, in an embodiment of two-sided GIDL erase holes are provided from both the drain side and the source side.

Step 1201 includes applying Vera to bit lines associated with the group of NAND strings being erased, here block N. Step 1203 includes applying a voltage (VSGDT) to the top drain side select gate (SGDT). The difference between Vera and VSGDT (Vera-VSGDT) is referred to herein as a drain GIDL generation voltage (SGDT_ERA). Each NAND string has a SGDT, which may include one or more transistors in series. For example, the top drain side select gate may be implemented in more than one layer (e.g., SGDT0, SGDT1, etc.), as in FIG. 4F. The voltage applied to the gates of the SGDT transistors GIDL, in combination with Vera applied to the bit lines, results in a GIDL current. Also, the GIDL voltage allows Vera to pass to the NAND channels. The drain GIDL generation voltage (SGDT_ERA) may be the same each loop of the erase process of FIG. 11. Thus, the magnitude of VSGDT applied to the gates of SGDT transistors may be increased from one erase loop to the next to account for an increase in Vera from one erase loop to the next.

Step 1205 includes applying Vera to the source line. Step 1207 includes applying a voltage to the gates of the SGSB transistors that will not generate any GIDL current. As one example, Vera-VSGSB is kept to a low voltage that will not result in GIDL current at the source ends of the NAND strings. For example, Vera-VSGSB may be about 5V or 6V. The combination of steps 1205 and 1207 will not result in GIDL current generation at the source end of the NAND strings. In another embodiment, rather than applying Vera to the source line, a much lower voltage is applied to the source line.

Step 1209 includes applying an erase enable voltage to the word lines connected to the group of NAND strings being erased. In one embodiment, the erase enable voltage is 0V but could be other than 0V such as about 0.5V. Thus, the erase of a memory cell includes applying an erase enable voltage (e.g., 0V) to the control gate of the memory cell while applying an erase voltage to a channel or body of the memory cell.

Returning to FIG. 11, after the erase pulse is applied at step 1105, a verify operation is performed at step 1107 to determine whether block passes the verify. If not, the erase loop count ELC is incremented to ELC+1 and the Vera level is increased by the step value of ΔVera, where this can be a settable parameter established as part of the device characterization process, for example. To avoid an unlimited number of loops, before looping back to step 1105, step 1117 checks the ELC value to see whether it is withing a loop guard band value, where this limit on the number of loops can be established as part of the device characterization process, for example. If the ELC value is below the limit, the flow loops back to 1105; and if the ELC limit has been reached, an erase status of fail is returned at step 1119 and the erase process discontinues and block N marked as bad.

Returning back to step 1107, if the selected block passes erase verify at step 1107, a tail detection read is performed on the GIDL related select gates SGDT and SGSB. These can be performed similarly to a read line read for data, but with a read voltage selected to determine GIDL related transistors with a voltage outside of the desired range and which can again be determined as part of the device characterization process. The discussion above focused on the upper tail and the read would determine the SGDT and SGSB having a Vth above the read value, but other embodiments can also include lower tail detection. Step 1111 determines the tail detection read status passes based on the number failed SGDT and SGSB transistors. As discussed more with respect to settable parameters, depending on the embodiment, this could be no failures, but most implementations can allow a limited number of failures, dealing with these though one or both of ECC and remapping of defective columns. If detect read status is not passed, the flow goes to step 1119 and returns a fail status. If the detect read status is passed, an erase status of pass is returned at step 1113 and the block can be added to the available block pool.

Under the arrangement of FIG. 11, the tail detection read and determination of steps 1109 and 1111 included into the flow of every erase where the block passes the erase verify pass at step 1107. Consequently, this introduces a time penalty into every successful erase. The smart tail detection read of FIG. 13 helps to reduce this time penalty.

FIG. 13 illustrates an embodiment for the incorporation of a smart tail detection read into the erase process. The flow begins with smart tail detection read being enabled at step 1301, followed by steps 1303, 1305, and 1307, which can be as described with respect to steps 1103, 1105 (including the detail of FIG. 12), and 1107, respectively, of FIG. 11. If erase verify is passed at step 1307, an erase status of pass is returned at step 1309, without inclusion of an intervening tail detection read as done in the flow of FIG. 11. The smart tail detection read follows on the No path from step 1307 at steps 1311, 1313, and 1315.

Step 1311 determines whether to perform the tail detection read based on the erase loop count ELC and the parameter SKIPLOOP_TDR: unless ELC=SKIPLOOP_TDR+1, the flow goes to step 1319, which can correspond to step 1115 of FIG. 11. Only if ELC=SKIPLOOP_TDR+1 is the tail detection read performed at step 1313 followed by a determination of a tail detection read status at step 1315, where these can respectively correspond to steps 1109 and 1111 of FIG. 11. If the block fails at step 1315, a fail status is returned at step 1317, which can be as described with respect to step 1119, and if the block passes at step 1315 the flow continues on to step 1319. Steps 1319 and 1321 can be as described above with respect to steps 1115 and 1117. Consequently, the tail detection read is only included in the erase loop for the single loop count value of ELC=SKIPLOOP_TDR+1 for blocks that do not pass erase verify for that ELC count, reducing the time penalty imposed on the erase process.

A number of variations are available for embodiments of the smart tail detection read technique. For example, the flow of FIG. 13 is performed at the block level. Some embodiments of NAND memory are operable at a sub-block level. For example, referring back to FIG. 4F, on the drain side the NAND strings are selectable at a sub-block level, as indicated by the five NAND strings NS0-NS4, where these individual five strings can be representatives of, in this example, five sub-blocks, sometimes known as "fingers" or "strings" (which in turn are made up of multiple individual NAND strings). In alternate embodiments, the smart tail detection read technique can be implemented at this sub-block level, with smart tail detection read triggered sub-block by sub-block, where, if any sub-block fails for the tail detection read, tail detection read can either be terminated to save erase time or proceed on remaining sub-block to keep design simple.

In other alternate embodiments, smart tail detection read is only triggered once in FIG. 13 to save erase time. The trigger point can be tuned by setting SKIPLOOP_TDR to better compatible with different device specifications. For example, when most of good blocks pass erase with 2 loops, SKIPLOOP_TDR can be trimmed to 1 for skipping one loop and do tail detection read erase verify after the second loop.

The embodiment of FIG. 13 only looks at the GIDL related select gates of one or both of SGDT and SGSB, the other select gates of SGD and/or SGS can be included for detection of one or both of lower tail and upper tail detection in the smart tail detection read mode if, for example, an upper tail issue occurs during technology development.

A number of settable parameters can be used for a smart tail detection read mode. The parameters can include the skipped erase loop count, SKIPLOOP_TDR, to trigger smart tail detection read discussed above, which can run from 0 to one less than the maximum erase loop count value. Another parameter can be used to enable or disable smart detect read, specify tail detection read layer, and read sequence with different bits. Other parameters can be used to specify the control gate voltage for tail detection read for SGDT and SGSB, each individually settable to, for example, 3.0V, 3.2V, 3.4V, 3.6V, . . . , for example. A parameter can also be used to set the failed bit criteria of step 1315, such as 16 bits, 32 bits, 64 bits, or other values.

For any of the variations presented above, the smart tail detection read technique can catch problematic blocks with only a relatively minor increase in erase times. The finetuning of the associated parameters during device testing can be used to optimize the tradeoff between the catch ratio and overkill.

One embodiment includes a non-volatile storage apparatus, comprising a control circuit configured to attach to a plurality of blocks of non-volatile memory cells, each of the blocks comprising a plurality of NAND strings that each comprising a plurality of the non-volatile memory cells connected series between one or more drain side select gates and one or more source side select gates. The control circuit is configured to: select a block for an erase operation; maintain a count of a number of erase-verify loops experiences by the selected block during the erase operation; apply an erase pulse to the selected block; and, subsequent to applying the erase pulse to the selected block, perform an erase verify operation on the selected block. The control circuit is further configured to: in response to the selected block failing the erase verify operation, determine whether the count is equal to a first parameter; in response to the count not equaling the first parameter, increment the count and apply an additional erase pulse the selected block; in response to the count equaling the first parameter, perform a first read operation to determine a distribution of threshold voltages for a first of the select gates for each of the NAND strings of the selected block; determine whether the distribution of threshold voltages of the first of the select gates for each of the NAND strings of the selected block has a number of the first select gates greater than a second parameter in a tail of the distribution; in response to the number of the first select gates being greater than the second parameter in the tail of the distribution, return an erase status of fail and discontinue the erase operation; and in response to the number of the first select gates not being greater than the second parameter in the tail of the distribution, increment the count and apply the additional erase pulse to the selected block.

One embodiment includes a method comprising: applying a sequence of one or more erase pulses to a block of non-volatile memory cells having a NAND architecture; maintaining an erase loop count of a number of the erase pluses of the sequence that have been applied to the block; subsequent to applying each of the erase pulses, performing an erase verify on the block; in response to the block not passing the erase verify, determining whether the erase loop count equals a first count value; in response to the erase loop count not equaling the first count value, incrementing the erase loop count and, for incremented erase loop counts less than a maximum value, applying the subsequent erase pulse of the sequence to the block; and in response to the erase loop count equaling the first count value, performing a tail detection read, the block including a plurality of NAND strings, each NAND string comprising a plurality of the memory cells connected in series between a corresponding bit line through one or more drain select gates and a source line though one or more source select gates. The tail detection read includes: performing a read on a first of the select gates of each of the NAND strings of the block; determining whether more than a first number of the first select gates have threshold voltages above a first voltage level; in response to more than the first number of the first select gates having threshold voltages above the first voltage level, marking the block as defective and discontinuing the sequence of erase pulses; and in response to less than the first number of the first select gates having threshold voltages above the first voltage level, incrementing the erase loop count and, for incremented erase loop counts less than a maximum value, applying the subsequent erase pulse of the sequence to the block.

One embodiment includes a non-volatile memory device, comprising: an array of non-volatile memory cells comprising a plurality of blocks, each block including a plurality of NAND strings, each NAND string comprising a plurality of the memory cells connected in series between a corresponding bit line through one or more drain select gates and a source line though one or more source select gates; and one or more control circuits configured to connect to the array. The one or more control circuits are configured to: apply a sequence of one or more erase pulses to a block of non-volatile memory cells having a NAND architecture; maintain an erase loop count of a number of the erase pluses of the sequence that have been applied to the block; subsequent to applying each of the erase pulses, perform an erase verify on the block; in response to the block not passing the erase verify, determine whether the erase loop count equals a first count value; in response to the erase loop count not equaling the first count value, increment the erase loop count and, for incremented erase loop counts less than a maximum value, apply the subsequent erase pulse of the sequence to the block; and in response to the erase loop count equaling the first count value, perform a tail detection read, where, to perform the tail detection read. The one or more control circuits are configured to: perform a read on a first of the select gates of each of the NAND strings of the block; determine whether more than a first number of the first select gates have threshold voltages above a first voltage level; in response to more than the first number of the first select gates having threshold voltages above the first voltage level, mark the block as defective and discontinue the sequence of erase pulses; and in response to less than the first number of the first select gates having threshold voltages above the first voltage level, increment the erase loop count and, for incremented erase loop counts less than a maximum value, apply the subsequent erase pulse of the sequence to the block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:

a control circuit configured to attach to a plurality of blocks of non-volatile memory cells, each of the blocks comprising a plurality of NAND strings that each comprise a plurality of the non-volatile memory cells connected series between one or more drain side select gates and one or more source side select gates, the control circuit configured to:

select a block for an erase operation;

maintain a count of a number of erase-verify loops experiences by the selected block during the erase operation;

apply an erase pulse to the selected block;

subsequent to applying the erase pulse to the selected block, perform an erase verify operation on the selected block;

in response to the selected block failing the erase verify operation, determine whether the count is equal to a first parameter;

in response to the count not equaling the first parameter, increment the count and apply an additional erase pulse the selected block;

in response to the count equaling the first parameter, perform a first read operation to determine a distribution of threshold voltages for a first of the select gates for each of the NAND strings of the selected block;

determine whether the distribution of threshold voltages of the first of the select gates for each of the NAND strings of the selected block has a number of the first select gates greater than a second parameter in a tail of the distribution;

in response to the number of the first select gates being greater than the second parameter in the tail of the distribution, return an erase status of fail and discontinue the erase operation; and in response to the number of the first select gates not being greater than the second parameter in the tail of the distribution, increment the count and apply the additional erase pulse the selected block.

2. The non-volatile storage apparatus of claim 1, wherein at least a portion of the control circuit is formed on a control die, the non-volatile storage device further comprising:

a memory die including the plurality of blocks of non-volatile memory cells, the memory die separate from and bonded to the control die.

3. The non-volatile storage apparatus of claim 1, wherein the tail of the distribution is an upper tail.

4. The non-volatile storage apparatus of claim 1, wherein the first select gates are drain side select gates.

5. The non-volatile storage apparatus of claim 1, wherein the first select gates are source side select gates.

6. The non-volatile storage apparatus of claim 1, wherein the erase operation is a gate induced drain leakage (GIDL) mechanism type of erase and the control circuit is further configured to:

concurrently with applying the erase pulse to the selected block, bias the first select gates to induce the GIDL mechanism.

7. The non-volatile storage apparatus of claim 6, wherein the first select gates are drain side select gates and the drain side select gates include, for each NAND string of the selected block, one or more additional drain side select gates connected between the memory cells and the first select gate.

8. The non-volatile storage apparatus of claim 1, wherein the additional erase pulse is of greater amplitude than a preceding erase pulse.

9. The non-volatile storage apparatus of claim 1, wherein the control circuit is further configured to:

subsequent to incrementing the count and prior applying the additional erase pulse the selected block, determine whether the count has reached a limit value; and in response to the count reaching the limit value, return an erase status of fail and discontinue the erase operation.

10. The non-volatile storage apparatus of claim 1, further comprising:

an array of non-volatile memory cells, the array including the blocks of non-volatile memory cells and having a three dimensional architecture in which the NAND string extend horizontally above a substrate.

11. The non-volatile storage apparatus of claim 1, wherein the first parameter and the second parameter are settable parameters.

12. A method, comprising:

applying a sequence of one or more erase pulses to a block of non-volatile memory cells having a NAND architecture;

maintaining an erase loop count of a number of the erase pluses of the sequence that have been applied to the block;

subsequent to applying each of the erase pulses, performing an erase verify on the block;

in response to the block not passing the erase verify, determining whether the erase loop count equals a first count value;

in response to the erase loop count not equaling the first count value, incrementing the erase loop count and, for incremented erase loop counts less than a maximum value, applying the subsequent erase pulse of the sequence to the block; and in response to the erase loop count equaling the first count value, performing a tail detection read, the block including a plurality of NAND strings, each NAND string comprising a plurality of the memory cells connected in series between a corresponding bit line through one or more drain select gates and a source line though one or more source select gates, the tail detection read including:

performing a read on a first of the select gates of each of the NAND strings of the block;

determining whether more than a first number of the first select gates have threshold voltages above a first voltage level;

in response to more than the first number of the first select gates having threshold voltages above the first voltage level, marking the block as defective and discontinuing the sequence of erase pulses; and in response to less than the first number of the first select gates having threshold voltages above the first voltage level, incrementing the erase loop count and, for incremented erase loop counts less than a maximum value, applying the subsequent erase pulse of the sequence to the block.

13. The method of claim 12, further comprising:

concurrently with applying the erase pulse to the selected block, biasing the first select gates to effect a gate induced drain leakage mechanism type of erase.

14. The method of claim 13, wherein the first select gates are drain side select gates and the drain side select gates include, for each NAND string of the selected block, one or more additional drain side select gates connected between the memory cells and the first select gate.

15. The method of claim 12, further comprising:

increasing an amplitude of the erase pulse for each erase pulse of the sequence.

16. A non-volatile memory device, comprising:

an array of non-volatile memory cells comprising a plurality of blocks, each block including a plurality of NAND strings, each NAND string comprising a plurality of the memory cells connected in series between a corresponding bit line through one or more drain select gates and a source line though one or more source select gates; and one or more control circuits configured to connect to the array and configured to:

apply a sequence of one or more erase pulses to a block of non-volatile memory cells having a NAND architecture;

maintain an erase loop count of a number of the erase pluses of the sequence that have been applied to the block;

subsequent to applying each of the erase pulses, perform an erase verify on the block;

in response to the block not passing the erase verify, determine whether the erase loop count equals a first count value;

in response to the erase loop count not equaling the first count value, increment the erase loop count and, for incremented erase loop counts less than a maximum value, apply the subsequent erase pulse of the sequence to the block; and in response to the erase loop count equaling the first count value, perform a tail detection read, where, to perform the tail detection read, the one or more control circuits are configured to:

perform a read on a first of the select gates of each of the NAND strings of the block;

determine whether more than a first number of the first select gates have threshold voltages above a first voltage level;

in response to more than the first number of the first select gates having threshold voltages above the first voltage level, mark the block as defective and discontinue the sequence of erase pulses; and in response to less than the first number of the first select gates having threshold voltages above the first voltage level, increment the erase loop count and, for incremented erase loop counts less than a maximum value, apply the subsequent erase pulse of the sequence to the block.

17. The non-volatile memory device of claim 16, wherein the one or more control circuits are further configured to:

concurrently with applying the erase pulse to the selected block, bias the first select gates to effect a gate induced drain leakage mechanism type of erase.

18. The non-volatile memory device of claim 17, wherein the first select gates are drain side select gates and the drain side select gates include, for each NAND string of the selected block, one or more additional drain side select gates connected between the memory cells and the first select gate.

19. The non-volatile memory device of claim 16, wherein the one or more control circuits are further configured to:

increase an amplitude of the erase pulse for each erase pulse of the sequence.

20. The non-volatile memory device of claim 16, wherein the array including the blocks of non-volatile memory cells and having a three dimensional architecture in which NAND string extend horizontally above a substrate.

* * * * *